US008971751B2

(12) United States Patent
Kosaka

(10) Patent No.: US 8,971,751 B2
(45) Date of Patent: Mar. 3, 2015

(54) PIEZOELECTRIC TRANSDUCER DRIVER, POWER SUPPLY DEVICE, AND IMAGE FORMATION APPARATUS

(75) Inventor: Toru Kosaka, Tokyo (JP)

(73) Assignee: Oki Data Corporation, Tokyo (JP)

( * ) Notice: Subject to any disclaimer, the term of this patent is extended or adjusted under 35 U.S.C. 154(b) by 356 days.

(21) Appl. No.: 13/530,205

(22) Filed: Jun. 22, 2012

(65) Prior Publication Data

US 2012/0328322 A1 Dec. 27, 2012

(30) Foreign Application Priority Data

Jun. 22, 2011 (JP) ................................ 2011-138502

(51) Int. Cl.
*G03G 15/00* (2006.01)
*H01L 41/04* (2006.01)

(52) U.S. Cl.
CPC .............. *G03G 15/80* (2013.01); *H01L 41/042* (2013.01)
USPC ........................................................... 399/88

(58) Field of Classification Search
USPC ........................................................... 399/88
See application file for complete search history.

(56) References Cited

FOREIGN PATENT DOCUMENTS

| | | |
|---|---|---|
| JP | 2007-189880 A | 7/2007 |
| JP | 2010-148321 A | 7/2010 |
| JP | 2010-172180 A | 8/2010 |
| JP | 2011-097699 A | 5/2011 |

*Primary Examiner* — Quana M Grainger
(74) *Attorney, Agent, or Firm* — Marvin A. Motsenbocker; Mots Law, PLLC

(57) ABSTRACT

A piezoelectric transducer driver configured to drive a piezoelectric transducer for converting an inputted alternating-current voltage, includes: a drive circuit configured to generate the alternating-current voltage to be inputted into the piezoelectric transducer; a frequency controller configured to control a frequency of the alternating-current voltage as a drive frequency to be applied to the piezoelectric transducer; and a pulse generation circuit configured to generate a drive pulse having a switching frequency corresponding to the drive frequency, and to output the drive pulse to the drive circuit. The drive circuit includes a switching element configured to generate the alternating-current voltage by executing a switching operation corresponding to a pulse width of the drive pulse, and the pulse generation circuit changes the pulse width depending on the switching frequency.

22 Claims, 25 Drawing Sheets

PRINTER ENGINE CONTROLLER
253
HIGH-VOLTAGE CONTROLLER
RST
CLK_IN
VIN
OUT_K
AIN_K
260K
309
310
8
311K
424
419
VIN
Q0
OE
GND
418
3.3V
24V
302
303K
350K
401
402
403
404
430
Ng
Na
Nb
304K
305K
405
406
407
408
409
410
411
412
413
307K
426
LOAD
306K

FIG. 9

INPUT VALUES AND OUTPUT VALUES IN TABLE REGISTER

| INPUT VALUE 8bit | OUTPUT VALUE 8bit | FREQUENCY DIVISION RATIO INTEGER PORTION | INPUT VALUE 8bit | OUTPUT VALUE 8bit | FREQUENCY DIVISION RATIO INTEGER PORTION | INPUT VALUE 8bit | OUTPUT VALUE 8bit | FREQUENCY DIVISION RATIO INTEGER PORTION | INPUT VALUE 8bit | OUTPUT VALUE 8bit | FREQUENCY DIVISION RATIO INTEGER PORTION | INPUT VALUE 8bit | OUTPUT VALUE 8bit | FREQUENCY DIVISION RATIO INTEGER PORTION |
|---|---|---|---|---|---|---|---|---|---|---|---|---|---|---|
| 00hex | 00hex | 100hex | 20hex | 00hex | 120hex | 40hex | 00hex | 140hex | 60hex | FFhex | 160hex | 80hex | FFhex | 180hex |
| 01hex | 00hex | 101hex | 21hex | 00hex | 121hex | 41hex | 00hex | 141hex | 61hex | FFhex | 161hex | 81hex | FFhex | 181hex |
| 02hex | 00hex | 102hex | 22hex | 00hex | 122hex | 42hex | 00hex | 142hex | 62hex | FFhex | 162hex | 82hex | FFhex | 182hex |
| 03hex | 00hex | 103hex | 23hex | 00hex | 123hex | 43hex | 00hex | 143hex | 63hex | FFhex | 163hex | 83hex | FFhex | 183hex |
| 04hex | 00hex | 104hex | 24hex | 00hex | 124hex | 44hex | 00hex | 144hex | 64hex | FFhex | 164hex | 84hex | FFhex | 184hex |
| 05hex | 00hex | 105hex | 25hex | 00hex | 125hex | 45hex | 00hex | 145hex | 65hex | FFhex | 165hex | 85hex | FFhex | 185hex |
| 06hex | 00hex | 106hex | 26hex | 00hex | 126hex | 46hex | 00hex | 146hex | 66hex | FFhex | 166hex | 86hex | FFhex | 186hex |
| 07hex | 00hex | 107hex | 27hex | 00hex | 127hex | 47hex | 00hex | 147hex | 67hex | FFhex | 167hex | 87hex | FFhex | 187hex |
| 08hex | 00hex | 108hex | 28hex | 00hex | 128hex | 48hex | 00hex | 148hex | 68hex | FFhex | 168hex | 88hex | FFhex | 188hex |
| 09hex | 00hex | 109hex | 29hex | 00hex | 129hex | 49hex | 00hex | 149hex | 69hex | FFhex | 169hex | 89hex | FFhex | 189hex |
| 0Ahex | 00hex | 10Ahex | 2Ahex | 00hex | 12Ahex | 4Ahex | 00hex | 14Ahex | 6Ahex | FFhex | 16Ahex | 8Ahex | FFhex | 18Ahex |
| 0Bhex | 00hex | 10Bhex | 2Bhex | 00hex | 12Bhex | 4Bhex | 00hex | 14Bhex | 6Bhex | FFhex | 16Bhex | 8Bhex | FFhex | 18Bhex |
| 0Chex | 00hex | 10Chex | 2Chex | 00hex | 12Chex | 4Chex | 00hex | 14Chex | 6Chex | FFhex | 16Chex | 8Chex | FFhex | 18Chex |
| 0Dhex | 00hex | 10Dhex | 2Dhex | 00hex | 12Dhex | 4Dhex | 00hex | 14Dhex | 6Dhex | FFhex | 16Dhex | 8Dhex | FFhex | 18Dhex |
| 0Ehex | 00hex | 10Ehex | 2Ehex | 00hex | 12Ehex | 4Ehex | 00hex | 14Ehex | 6Ehex | FFhex | 16Ehex | 8Ehex | FFhex | 18Ehex |
| 0Fhex | 00hex | 10Fhex | 2Fhex | 00hex | 12Fhex | 4Fhex | 00hex | 14Fhex | 6Fhex | FFhex | 16Fhex | 8Fhex | FFhex | 18Fhex |
| 10hex | 00hex | 110hex | 30hex | 00hex | 130hex | 50hex | 00hex | 150hex | 70hex | FFhex | 170hex | 90hex | 80hex | 190hex |
| 11hex | 00hex | 111hex | 31hex | 00hex | 131hex | 51hex | 00hex | 151hex | 71hex | FFhex | 171hex | 91hex | 7Chex | 191hex |
| 12hex | 00hex | 112hex | 32hex | 00hex | 132hex | 52hex | FFhex | 152hex | 72hex | FFhex | 172hex | 92hex | 78hex | 192hex |
| 13hex | 00hex | 113hex | 33hex | 00hex | 133hex | 53hex | FFhex | 153hex | 73hex | FFhex | 173hex | 93hex | 74hex | 193hex |
| 14hex | 00hex | 114hex | 34hex | 00hex | 134hex | 54hex | FFhex | 154hex | 74hex | FFhex | 174hex | 94hex | 70hex | 194hex |
| 15hex | 00hex | 115hex | 35hex | 00hex | 135hex | 55hex | FFhex | 155hex | 75hex | FFhex | 175hex | 95hex | 6Chex | 195hex |
| 16hex | 00hex | 116hex | 36hex | 00hex | 136hex | 56hex | FFhex | 156hex | 76hex | FFhex | 176hex | 96hex | 68hex | 196hex |
| 17hex | 00hex | 117hex | 37hex | 00hex | 137hex | 57hex | FFhex | 157hex | 77hex | FFhex | 177hex | 97hex | 64hex | 197hex |
| 18hex | 00hex | 118hex | 38hex | 00hex | 138hex | 58hex | FFhex | 158hex | 78hex | FFhex | 178hex | 98hex | 60hex | 198hex |
| 19hex | 00hex | 119hex | 39hex | 00hex | 139hex | 59hex | FFhex | 159hex | 79hex | FFhex | 179hex | 99hex | 5Chex | 199hex |
| 1Ahex | 00hex | 11Ahex | 3Ahex | 00hex | 13Ahex | 5Ahex | FFhex | 15Ahex | 7Ahex | FFhex | 17Ahex | 9Ahex | 58hex | 19Ahex |
| 1Bhex | 00hex | 11Bhex | 3Bhex | 00hex | 13Bhex | 5Bhex | FFhex | 15Bhex | 7Bhex | FFhex | 17Bhex | 9Bhex | 54hex | 19Bhex |
| 1Chex | 00hex | 11Chex | 3Chex | 00hex | 13Chex | 5Chex | FFhex | 15Chex | 7Chex | FFhex | 17Chex | 9Chex | 50hex | 19Chex |
| 1Dhex | 00hex | 11Dhex | 3Dhex | 00hex | 13Dhex | 5Dhex | FFhex | 15Dhex | 7Dhex | FFhex | 17Dhex | 9Dhex | 4Chex | 19Dhex |
| 1Ehex | 00hex | 11Ehex | 3Ehex | 00hex | 13Ehex | 5Ehex | FFhex | 15Ehex | 7Ehex | FFhex | 17Ehex | 9Ehex | 48hex | 19Ehex |
| 1Fhex | 00hex | 11Fhex | 3Fhex | 00hex | 13Fhex | 5Fhex | FFhex | 15Fhex | 7Fhex | FFhex | 17Fhex | 9Fhex | 44hex | 19Fhex |

FIG. 10

INPUT VALUES AND OUTPUT VALUES IN TABLE REGISTER

| INPUT VALUE 8bit | OUTPUT VALUE 8bit | FREQUENCY DIVISION RATIO INTEGER PORTION |
|---|---|---|
| A0hex | 40hex | 1A0hex |
| A1hex | 3Chex | 1A1hex |
| A2hex | 38hex | 1A2hex |
| A3hex | 34hex | 1A3hex |
| A4hex | 30hex | 1A4hex |
| A5hex | 2Chex | 1A5hex |
| A6hex | 28hex | 1A6hex |
| A7hex | 24hex | 1A7hex |
| A8hex | 20hex | 1A8hex |
| A9hex | 1Chex | 1A9hex |
| AAhex | 18hex | 1AAhex |
| ABhex | 14hex | 1ABhex |
| AChex | 10hex | 1AChex |
| ADhex | 0Chex | 1ADhex |
| AEhex | 08hex | 1AEhex |
| AFhex | 04hex | 1AFhex |
| B0hex | 02hex | 1B0hex |
| B1hex | 01hex | 1B1hex |
| B2hex | 01hex | 1B2hex |
| B3hex | 01hex | 1B3hex |
| B4hex | 01hex | 1B4hex |
| B5hex | 01hex | 1B5hex |
| B6hex | 01hex | 1B6hex |
| B7hex | 01hex | 1B7hex |
| B8hex | 01hex | 1B8hex |
| B9hex | 01hex | 1B9hex |
| BAhex | 01hex | 1BAhex |
| BBhex | 01hex | 1BBhex |
| BChex | 01hex | 1BChex |
| BDhex | 01hex | 1BDhex |
| BEhex | 01hex | 1BEhex |
| BFhex | 01hex | 1BFhex |

| INPUT VALUE 8bit | OUTPUT VALUE 8bit | FREQUENCY DIVISION RATIO INTEGER PORTION |
|---|---|---|
| C0hex | 01hex | 1C0hex |
| C1hex | 01hex | 1C1hex |
| C2hex | 01hex | 1C2hex |
| C3hex | 01hex | 1C3hex |
| C4hex | 01hex | 1C4hex |
| C5hex | 01hex | 1C5hex |
| C6hex | 01hex | 1C6hex |
| C7hex | 01hex | 1C7hex |
| C8hex | 01hex | 1C8hex |
| C9hex | 01hex | 1C9hex |
| CAhex | 01hex | 1CAhex |
| CBhex | 01hex | 1CBhex |
| CChex | 01hex | 1CChex |
| CDhex | 01hex | 1CDhex |
| CEhex | 01hex | 1CEhex |
| CFhex | 01hex | 1CFhex |
| D0hex | 00hex | 1D0hex |
| D1hex | 00hex | 1D1hex |
| D2hex | 00hex | 1D2hex |
| D3hex | 00hex | 1D3hex |
| D4hex | 00hex | 1D4hex |
| D5hex | 00hex | 1D5hex |
| D6hex | 00hex | 1D6hex |
| D7hex | 00hex | 1D7hex |
| D8hex | 00hex | 1D8hex |
| D9hex | 00hex | 1D9hex |
| DAhex | 00hex | 1DAhex |
| DBhex | 00hex | 1DBhex |
| DChex | 00hex | 1DChex |
| DDhex | 00hex | 1DDhex |
| DEhex | 00hex | 1DEhex |
| DFhex | 00hex | 1DFhex |

| INPUT VALUE 8bit | OUTPUT VALUE 8bit | FREQUENCY DIVISION RATIO INTEGER PORTION |
|---|---|---|
| E0hex | 00hex | 1E0hex |
| E1hex | 00hex | 1E1hex |
| E2hex | 00hex | 1E2hex |
| E3hex | 00hex | 1E3hex |
| E4hex | 00hex | 1E4hex |
| E5hex | 00hex | 1E5hex |
| E6hex | 00hex | 1E6hex |
| E7hex | 00hex | 1E7hex |
| E8hex | 00hex | 1E8hex |
| E9hex | 00hex | 1E9hex |
| EAhex | 00hex | 1EAhex |
| EBhex | 00hex | 1EBhex |
| EChex | 00hex | 1EChex |
| EDhex | 00hex | 1EDhex |
| EEhex | 00hex | 1EEhex |
| EFhex | 00hex | 1EFhex |
| F0hex | 00hex | 1F0hex |
| F1hex | 00hex | 1F1hex |
| F2hex | 00hex | 1F2hex |
| F3hex | 00hex | 1F3hex |
| F4hex | 00hex | 1F4hex |
| F5hex | 00hex | 1F5hex |
| F6hex | 00hex | 1F6hex |
| F7hex | 00hex | 1F7hex |
| F8hex | 00hex | 1F8hex |
| F9hex | 00hex | 1F9hex |
| FAhex | 00hex | 1FAhex |
| FBhex | 00hex | 1FBhex |
| FChex | 00hex | 1FChex |
| FDhex | 00hex | 1FDhex |
| FEhex | 00hex | 1FEhex |
| FFhex | 00hex | 1FFhex |

FIG. 11

INPUT VALUES AND OUTPUT VALUES IN LOOK-UP TABLE

| INPUT VALUE 9bit | OUTPUT VALUE 9bit | INPUT VALUE 9bit | OUTPUT VALUE 9bit | INPUT VALUE 9bit | OUTPUT VALUE 9bit | INPUT VALUE 9bit | OUTPUT VALUE 9bit |
|---|---|---|---|---|---|---|---|
| 000hex | 000hex | 170hex | 052hex | 191hex | 079hex | 1B2hex | 0A5hex |
| ~ | ~ | 171hex | 053hex | 192hex | 07Ahex | 1B3hex | 0A7hex |
| 151hex | 000hex | 172hex | 054hex | 193hex | 07Bhex | 1B4hex | 0A8hex |
| 152hex | 033hex | 173hex | 055hex | 194hex | 07Dhex | 1B5hex | 0A9hex |
| 153hex | 034hex | 174hex | 056hex | 195hex | 07Ehex | 1B6hex | 0ABhex |
| 154hex | 035hex | 175hex | 057hex | 196hex | 07Fhex | 1B7hex | 0AChex |
| 155hex | 036hex | 176hex | 058hex | 197hex | 080hex | 1B8hex | 0AEhex |
| 156hex | 037hex | 177hex | 05Ahex | 198hex | 082hex | 1B9hex | 0AFhex |
| 157hex | 038hex | 178hex | 05Bhex | 199hex | 083hex | 1BAhex | 0B1hex |
| 158hex | 039hex | 179hex | 05Chex | 19Ahex | 084hex | 1BBhex | 0B2hex |
| 159hex | 03Ahex | 17Ahex | 05Dhex | 19Bhex | 086hex | 1BChex | 0B4hex |
| 15Ahex | 03Bhex | 17Bhex | 05Ehex | 19Chex | 087hex | 1BDhex | 0B5hex |
| 15Bhex | 03Chex | 17Chex | 05Fhex | 19Dhex | 088hex | 1BEhex | 0B7hex |
| 15Chex | 03Dhex | 17Dhex | 060hex | 19Ehex | 08Ahex | 1BFhex | 0B8hex |
| 15Dhex | 03Ehex | 17Ehex | 062hex | 19Fhex | 08Bhex | 1C0hex | 0B9hex |
| 15Ehex | 03Fhex | 17Fhex | 063hex | 1A0hex | 08Chex | 1C1hex | 0BBhex |
| 15Fhex | 040hex | 180hex | 064hex | 1A1hex | 08Ehex | 1C2hex | 0BChex |
| 160hex | 041hex | 181hex | 065hex | 1A2hex | 08Fhex | 1C3hex | 0BEhex |
| 161hex | 042hex | 182hex | 066hex | 1A3hex | 090hex | 1C4hex | 0BFhex |
| 162hex | 043hex | 183hex | 068hex | 1A4hex | 092hex | 1C5hex | 0C1hex |
| 163hex | 044hex | 184hex | 069hex | 1A5hex | 093hex | 1C6hex | 0C2hex |
| 164hex | 045hex | 185hex | 06Ahex | 1A6hex | 094hex | 1C7hex | 0C4hex |
| 165hex | 046hex | 186hex | 06Bhex | 1A7hex | 096hex | 1C8hex | 0C6hex |
| 166hex | 047hex | 187hex | 06Chex | 1A8hex | 097hex | 1C9hex | 0C7hex |
| 167hex | 048hex | 188hex | 06Ehex | 1A9hex | 098hex | 1CAhex | 0C9hex |
| 168hex | 049hex | 189hex | 06Fhex | 1AAhex | 09Ahex | 1CBhex | 0CAhex |
| 169hex | 04Ahex | 18Ahex | 070hex | 1ABhex | 09Bhex | 1CChex | 0CChex |
| 16Ahex | 04Bhex | 18Bhex | 071hex | 1AChex | 09Dhex | 1CDhex | 0CDhex |
| 16Bhex | 04Chex | 18Chex | 073hex | 1ADhex | 09Ehex | 1CEhex | 0CFhex |
| 16Chex | 04Dhex | 18Dhex | 074hex | 1AEhex | 09Fhex | 1CFhex | 0D0hex |
| 16Dhex | 04Ehex | 18Ehex | 075hex | 1EFhex | 0A1hex | 1D0hex | 000hex |
| 16Ehex | 04Fhex | 18Fhex | 076hex | 1B0hex | 0A2hex | ~ | ~ |
| 16Fhex | 051hex | 190hex | 078hex | 1B1hex | 0A4hex | 1FFhex | 000hex |

FIG. 12

RELATIONSHIPS BETWEEN DRIVE FREQUENCIES AND OUTPUTS

| FREQUENCY DIVISION RATIO INTEGER PORTION | FREQUENCY (kHz) | OUTPUT VOLTAGE (V) |
|---|---|---|
| 152hex | 147.93 | 80 |
| 154hex | 147.06 | 120 |
| 16Fhex | 135.87 | 160 |
| 190hex | 125.00 | 200 |
| 199hex | 121.95 | 240 |
| 1A1hex | 119.62 | 280 |
| 1A5hex | 118.48 | 310 |
| 1B6hex | 114.16 | 630 |
| 1BChex | 112.61 | 940 |
| 1C0hex | 111.61 | 1260 |
| 1C2hex | 111.11 | 1570 |
| 1C3hex | 110.62 | 1880 |
| 1C6hex | 110.13 | 2510 |
| 1C7hex | 109.65 | 3140 |
| 1CAhex | 109.17 | 5020 |
| 1CBhex | 108.70 | 7530 |

FIG. 20

| DRIVE FREQUENCY (kHz) | DRAIN POTENTIAL 0V |
|---|---|
| 147.93 | 15% |
| 147.06 | 18% |
| 135.87 | 37% |
| 125.00 | 45% |
| 121.95 | 47% |
| 119.62 | 49% |
| 118.48 | 50% |
| 114.16 | 53% |
| 112.61 | 55% |
| 111.61 | 55% |
| 111.11 | 56% |
| 110.62 | 56% |
| 110.13 | 57% |
| 109.65 | 57% |
| 109.17 | 58% |
| 108.70 | 59% |

PIEZOELECTRIC TRANSDUCER DRIVER, POWER SUPPLY DEVICE, AND IMAGE FORMATION APPARATUS

CROSS REFERENCE TO RELATED APPLICATIONS

This application claims priority based on 35 USC 119 from prior Japanese Patent Application No. 2011-138502 filed on Jun. 22, 2011, entitled "PIEZOELECTRIC TRANSDUCER DRIVER, POWER SUPPLY DEVICE, AND IMAGE FORMATION APPARATUS", the entire contents of which are incorporated herein by reference.

BACKGROUND OF THE INVENTION

1. Field of the Invention

The present disclosure relates to a piezoelectric transducer driver configured to generate a voltage by driving a piezoelectric transducer, a power supply device including the piezoelectric transducer driver, and an image formation apparatus including the power supply device.

2. Description of Related Art

A piezoelectric transducer is a voltage transducer configured to convert an inputted alternating-current voltage and to output the converted voltage. Such piezoelectric transducers are widely used in power supply devices which are designed to generate drive voltages to be supplied to cold-cathode tubes of liquid crystal displays and the like, or to generate voltages to be supplied to transfer rollers and development rollers in electrographic image formation apparatuses, for example. An output characteristic (resonance characteristic) of a piezoelectric transducer varies depending on a change in impedance of a load such as a cold-cathode tube or a transfer roller to which the output voltage is to be supplied. Accordingly, in order to stabilize the output voltage, a frequency of the alternating-current voltage (a drive frequency) to be inputted into the piezoelectric transducer needs to be controlled in accordance with the change in the impedance of the load and the like. The drive frequency can be controlled by using an analog circuit such as a voltage-controlled oscillator (VCO). A power supply device using a VCO is disclosed in Japanese Patent Application Publication No. 2007-189880 (Document 1), for example.

However, the power supply device disclosed in Document 1 controls drive frequency in an analog mode, and therefore has problems of requiring a large number of components for the analog circuit, and having a difficulty in achieving flexible control. In this regard, drive frequency control using a digital circuit has been proposed in recent years. For example, Japanese Patent Application Publication No. 2010-148321 (Document 2) discloses: a power supply device configured to perform drive frequency control for a piezoelectric transducer in a digital mode; and an image formation apparatus including the power supply device.

The power supply device disclosed in Document 2 uses a switching element such as a power metal-oxide semiconductor field-effect transistor (power MOSFET) in order to generate an alternating-current voltage to be supplied to the piezoelectric transducer. The power supply device disclosed in Document 2 controls the drive frequency for the piezoelectric transducer within a predetermined frequency range by controlling the frequency of a drive pulse to be applied to a control terminal (a gate) of the power MOSFET. Moreover, this power supply device controls switching operation (on-and-off operation) of the power MOSFET while setting a substantially constant on-duty ratio (a ratio of a high-level period in one cycle) of the drive pulse which is to be applied to the gate of the power MOSFET and be used for driving the piezoelectric transducer. The drive frequency for the piezoelectric transducer is controlled within a range equal to or below about 130 kHz.

SUMMARY OF THE INVENTION

However, such a conventional power supply device has a problem of causing a failure or malfunction of the power MOSFET as a consequence of an attempt to drive the piezoelectric transducer at a high drive frequency of about 140 kHz or above, for example, in order to extend the output voltage range of the piezoelectric transducer to a lower voltage region.

An object of an embodiment of the invention is to prevent a failure or malfunction of a switching element configured to drive a piezoelectric transducer.

An aspect of the invention is a piezoelectric transducer driver configured to drive a piezoelectric transducer for converting an inputted alternating-current voltage. The piezoelectric transducer driver includes: a drive circuit configured to generate the alternating-current voltage to be inputted into the piezoelectric transducer; a frequency controller configured to control a frequency of the alternating-current voltage as a drive frequency to be applied to the piezoelectric transducer; and a pulse generation circuit configured to generate a drive pulse having a switching frequency corresponding to the drive frequency, and to output the drive pulse to the drive circuit. The drive circuit includes a switching element configured to generate the alternating-current voltage by executing a switching operation corresponding to a pulse width of the drive pulse, and the pulse generation circuit changes the pulse width depending on the switching frequency.

According to the aspect, the pulse generation circuit changes the pulse width of the drive pulse to be supplied to the switching element configured to drive the piezoelectric transducer in accordance with the switching frequency. Thus, a failure or malfunction of the switching element can be prevented.

BRIEF DESCRIPTION OF THE DRAWINGS

FIG. 9 is a table showing correspondence relationships between inputted values and outputted values in a table register of the first embodiment.

FIG. 10 is another table showing correspondence relationships between inputted values and outputted values in the table register of the first embodiment.

FIG. 11 is a table showing correspondence relationships between inputted values and outputted values stored in a look-up table of the first embodiment.

FIG. 12 is a table showing examples of values of outputted voltages corresponding to drive frequencies.

FIG. 20 is a table showing ratios (in percentage) of a 0-volt period in one cycle of the drain voltage, which are obtained from the measurement results in FIGS. 14A to 14C, 15A to 15C, 16A to 16C, 17A to 17C, 18A to 18C, and 19 and are sorted by the drive frequencies.

DETAILED DESCRIPTION OF EMBODIMENTS

Figure 1:
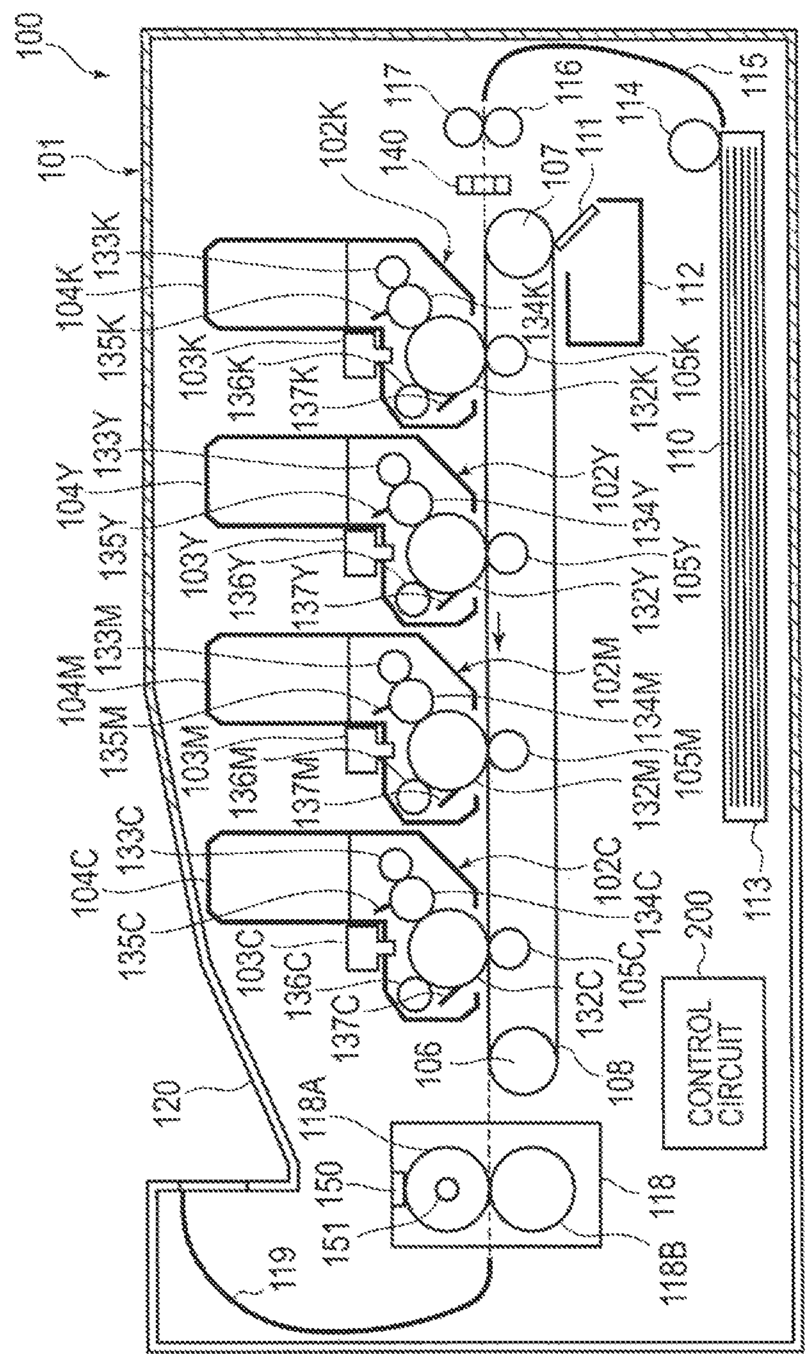
FIG. 1 is a view schematically showing a configuration of an image formation apparatus of a first embodiment of the invention.

Descriptions are provided hereinbelow for embodiments based on the drawings. In the respective drawings referenced herein, the same constituents are designated by the same reference numerals and duplicate explanation concerning the same constituents is omitted. All of the drawings are provided to illustrate the respective examples only.

Embodiments of the invention are described below by referring to the drawings.

First Embodiment

FIG. 1 is a view schematically showing a configuration of image formation apparatus 100 according to a first embodiment of the invention.

As shown in FIG. 1, inside housing 101, image formation apparatus 100 includes: cassette 113 configured to house record media 110 which are materials onto which images are transferred; hopping roller 114 configured to take record media 110 one by one out of this cassette 113; a guide member configured to guide record media 110 taken out of the cassette 113; paired resist rollers 116, 117; medium detection sensor 140 configured to detect record media 110; transfer belt 108 configured to be loaded with and convey record media 110; development units (image formation units) 102K, 102Y, 102M, 102C for four colors (black, yellow, magenta, and cyan); and toner cartridges (developer containers) 104K, 104Y, 104M, 104C detachably attached to development units 102K, 102Y, 102M, 102C, respectively. Toner cartridges 104K, 104Y, 104M, 104C contain black, yellow, magenta and cyan developers (toners), respectively.

Hopping roller 114 and paired resist rollers 116, 117 are rotated by receiving power transmission from a drive source, which is not illustrated, and thereby send record medium 110 taken out of cassette 113 at a given timing onto transfer belt (conveyance belt) 108 via medium detection sensor 140. Here, medium detection sensor 140 detects the passage of record medium 110 either in a state of contact or in a state of non-contact with record medium 110, and notifies control circuit 200 of a detection result. Incidentally, cassette 113 is detachably attached to image formation apparatus 100, and is capable of containing multiple record media 110 in a stacked state. Record media 110 may be sheet-shaped materials including paper, plastic films, synthetic paper, fabrics, and the like.

Moreover, image formation apparatus 100 includes: drive roller 106 configured to drive transfer belt 108; driven roller 107 which is driven by transfer belt 108; and transfer rollers 105B, 105Y, 105M, 105C which correspond to development units 102K, 102Y, 102M, 102C, respectively. Development units 102K, 102Y, 102M, 102C are arranged immediately above transfer belt 108 and in a moving direction of transfer belt 108. Meanwhile, transfer belt 108 is tightly wound around drive roller 106 and driven roller 107, and drive roller 106 moves transfer belt 108 by its counterclockwise rotation by receiving the power transmission from the drive source, which is not illustrated. As a consequence, record medium 110 loaded on transfer belt 108 passes immediately below development units 102K, 102Y, 102M, 102C sequentially.

Development units 102K, 102Y, 102M 102C are respectively located in positions facing transfer rollers 105K, 105Y, 105M, 105C with transfer belt 108 interposed therebetween. Development unit 102K for black images includes: photosensitive drum 132K; charge roller 136K configured to evenly charge the surface of photosensitive drum 132K; LED head (an exposure unit) 103K configured to perform exposure in order to form an electrostatic latent image on the surface of photosensitive drum 132K; development roller 134K being a developer carrier; development blade 135K; supply roller 133K configured to supply a black developer, which is fed from toner cartridge 104K, to development roller 134K; and cleaning blade 137K. Development blade 135K is configured to reduce the thickness of a developer layer (a toner layer) on the surface of development roller 134K. When a portion of the surface of photoconductive drum 132K, on which the electrostatic latent image is formed, reaches development roller 134K, the developer moves onto photosensitive drum 132K owing to a potential difference between the electrostatic latent image on photosensitive drum 132K and development roller 134K, thereby forming a developer image on photosensitive drum 132K. Then, the developer image on photosensitive drum 132K is transferred onto record medium 110 by means of transfer roller 105K. At this time, a transfer bias is applied to transfer roller 105K. Accordingly, the developer is transferred onto record medium 110 which is nipped (held by and) between transfer roller 105K and photosensitive drum 132K. Cleaning blade 137K has a function to scrape part of the developer which has not been transferred and remains on photosensitive drum 132K, off photosensitive drum 132*k* after the transfer of the developer.

The other development units 102Y, 102M, and 102C have a similar configuration to that of development unit 102K. Specifically, development unit 102Y for yellow images includes: photosensitive drum 132Y; charge roller 136Y configured to evenly charge a surface of photosensitive drum 132Y; LED head (exposure unit) 103Y configured to perform exposure on a surface of photosensitive drum 132Y; development roller 134Y being a developer carrier; development blade 135Y; supply roller 133Y configured to supply a yellow developer, which is fed from toner cartridge 104Y, to development roller 134Y; and cleaning blade 137Y. Meanwhile, development unit 102M for magenta images includes: photosensitive drum 132M; charge roller 136M configured to evenly charge a surface of photosensitive drum 132M; LED head (exposure unit) 103M configured to perform exposure on a surface of photosensitive drum 132M; development roller 134M being a developer carrier; development blade 135M; supply roller 133M configured to supply a magenta developer, which is fed from toner cartridge 104M, to development roller 134M; and cleaning blade 137M. In addition, development unit 102C for cyan images includes: photosensitive drum 132C; charge roller 136C configured to evenly charge a surface of photosensitive drum 132C; LED head (exposure unit) 103C configured to perform exposure on a surface of photosensitive drum 132C; development roller 134C being a developer carrier; development blade 135C; supply roller 133C configured to supply a cyan developer, which is fed from toner cartridge 104C, to development roller 134C; and cleaning blade 137C.

Note that each of photosensitive drums 132K, 132Y, 132M, 132C is formed from: a metallic pipe (a conductive base) made of aluminum, for example; and a photoconductive layer which is made of an organic photoconductor (OPC) and is formed around the metallic pipe.

Image formation apparatus 100 further includes fixation unit 118 and guide member 119. Fixation unit 118 has a function to melt the developer image, which is transferred onto recording medium 110, and to fix the image onto record medium 110 by applying pressure and heat to the developer image. Fixation unit 118 includes: cylindrical fixation roller 118A; and pressure roller 118B having a surface layer which is made of an elastic material. Fixation unit heater (heat source) 151, such as a halogen lamp, is disposed inside fixation roller 118A. A bias voltage is applied to fixation unit heater 151 by a power source, which is not illustrated. Thermistor 150 is a temperature detection sensor of a noncontact or contact type configured to detect a surface temperature of fixation roller 118A and to notify control circuit 200 of a detection result. Control circuit 200 is capable of controlling the temperature of fixation roller 118A by controlling the operation of fixation unit heater 151 based on the detection result obtained by thermistor 150. Guide member 119 discharges record medium 110 that is sent from fixation unit 118 onto tray 120 while putting record medium 110 face down.

Image formation apparatus 100 further includes cleaning blade 111. Cleaning blade 111 has a function to scrape off the developer (the toner) adhering to the surface of transfer belt 108 and to put the developer into cleaner container 112. Here, cleaner container 112 needs to be replaced more often if there is a larger amount of the developer adhering to the surface of transfer belt 108.

Figure 2:
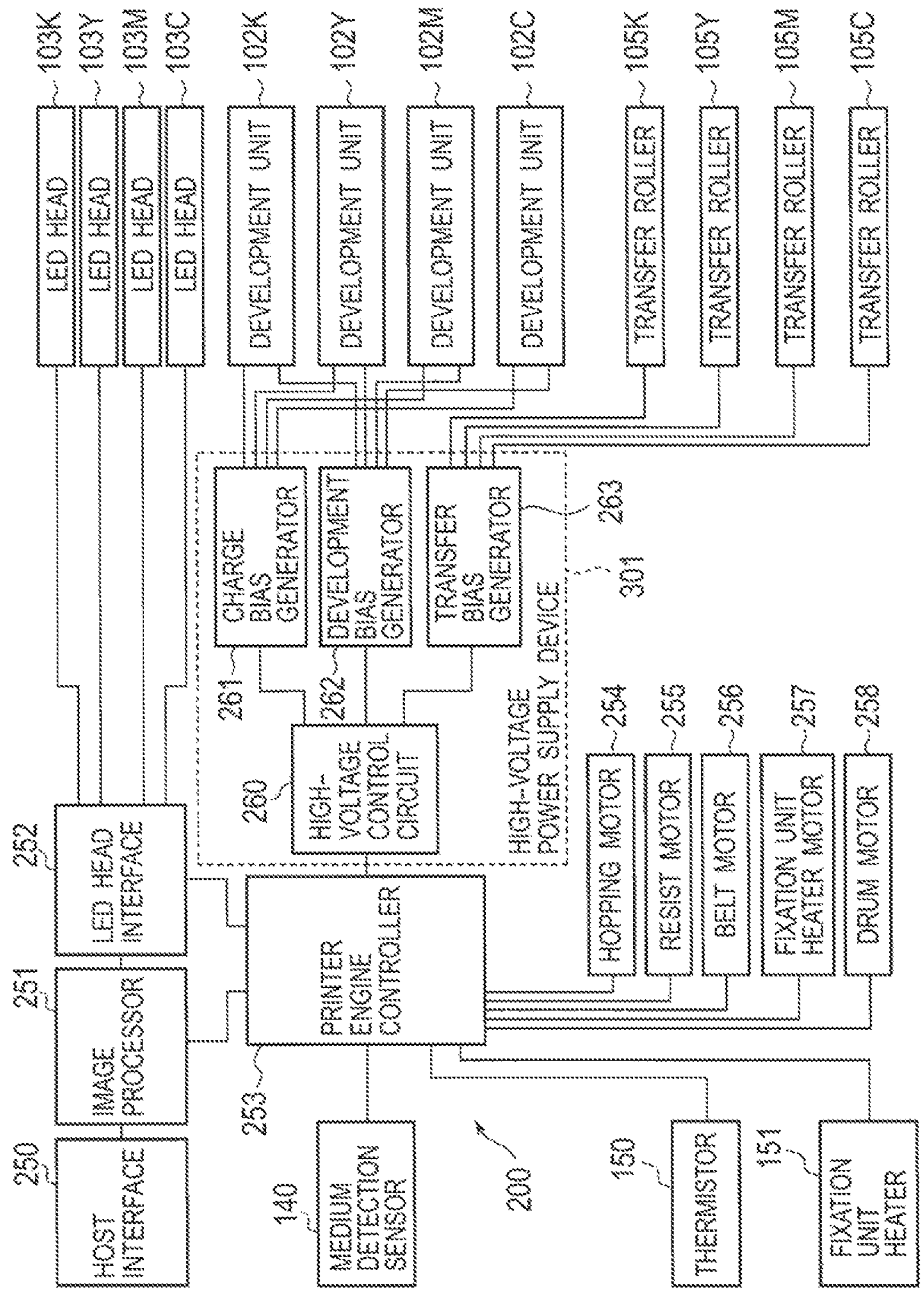
FIG. 2 is a functional block diagram showing a schematic configuration of a control circuit of the first embodiment.

Image formation apparatus 100 includes control circuit 200 configured to control overall operations of image formation apparatus 100. FIG. 2 is a functional block diagram showing a schematic configuration of control circuit 200.

As shown in FIG. 2, control circuit 200 includes host interface 250, image processor 251, LED head interface 252, printer engine controller 253, and high-voltage power supply device 301. High-voltage power supply device 301 includes high-voltage control circuit 260, charge bias generator 261, development bias generator 262, and transfer bias generator 263.

Host interface 250 has a communication interface function between an external device (a host), which is not illustrated, and image processor 251. When print data described in a format of PDL (Page Description Language) or the like is inputted from the external device to image processor 251 via host interface 250, image processor 251 generates bitmap data (image data) based on the inputted print data, and outputs the bitmap data to LED head interface 252 and to printer engine controller 253. LED head interface 252 is operated under control of the printer engine controller 253, and is able to output 4-channel drive signals respectively corresponding to black, yellow, magenta, and cyan based on the bitmap data. LED heads 103K, 103Y, 103M, 103C emit light based on the drive signals supplied from LED head interface 252.

Printer engine controller 253 controls the operation of high-voltage control circuit 260 by supplying various control signals to high-voltage control circuit 260. For example, printer engine controller 253 is capable of supplying control signals concerning values of charge biases, development biases, transfer biases, and the like to high-voltage control circuit 260 based on a detection result by medium detection sensor 140.

Charge bias generator 261 is operated under the control of high-voltage control circuit 260, and individually generates charge biases (direct-current voltages) to be supplied to charge rollers 136K, 136Y, 136M, 136C inside development units 102K, 102Y, 102M, 102C. Meanwhile, development bias generator 262 is operated under the control of high-voltage control circuit 260, and individually generates charge biases (direct-current voltages) to be supplied to development rollers 134K, 134Y, 134M, 134C inside development units 102K, 102Y, 102M, 102C. Moreover, transfer bias generator 263 is operated under the control of high-voltage control circuit 260, and individually generates transfer biases (direct-current voltages) to be supplied to transfer rollers 105K, 105Y, 105M, 105C. Here, high-voltage control circuit 260 is capable of individually controlling timings at which the transfer biases should be generated for transfer rollers 105K, 105Y, 105M, 105C based on the detection result by the medium detection sensor 140.

Meanwhile, printer engine controller 253 is capable of controlling: the operation of hopping motor 254 configured to rotate hopping roller 114 in FIG. 1; the operation of resist motor 255 configured to rotate resist rollers 116 117 in FIG. 1; and the operation of belt motor 256 configured to rotate drive roller 106. In addition, printer engine controller 253 is capable of controlling the operation of fixation unit heater motor 257 configured to generate a bias voltage to be supplied to fixation unit heater 151, and also controlling the operation of drum motor 258 configured to rotate photosensitive drums 132K, 132Y, 132M, 132C. Here, drum motor 258 includes four rotary drivers configured to individually rotate photosensitive drums 132K, 132Y, 132M, 132C. The operation of fixation unit heater 151 is controlled by printer engine controller 253 based on the temperature detected by thermistor 150.

Figure 3:
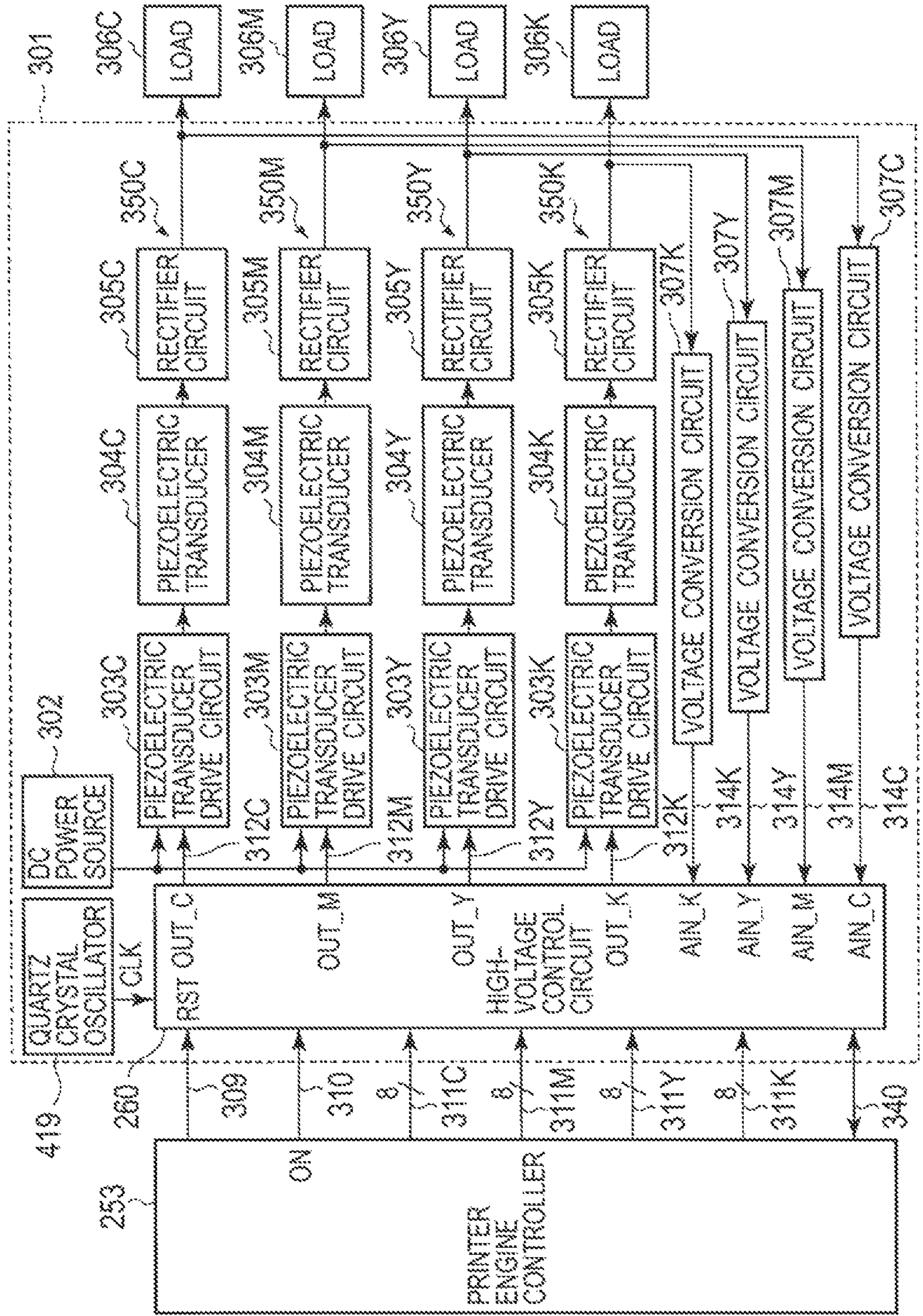
FIG. 3 is a functional block diagram showing part of a configuration of a high-voltage power supply device of the first embodiment.

FIG. 3 is a functional block diagram showing part of a configuration of high-voltage power supply device 301. As shown in FIG. 3, high-voltage power supply device 301 includes: quartz crystal oscillator 419; DC power source (direct-current voltage power source) 302; high-voltage control circuit 260; and transfer bias generation circuits 350K, 350Y, 350M, 350C corresponding to the four channels. Transfer bias generation circuits 350K, 350Y, 350M, 350C collectively constitute transfer bias generator 263 in FIG. 2. Note that charge bias generator 261 and development bias generator 262 in FIG. 2 are not illustrated in FIG. 3.

Transfer bias generation circuit 350K is a circuit configured to generate the transfer bias to be supplied to load 306K including transfer roller 105K for black images. Transfer bias generation circuit 350Y is a circuit configured to generate the transfer bias to be supplied to load 306Y including transfer roller 105Y for yellow images. Transfer bias generation circuit 350M is a circuit configured to generate the transfer bias to be supplied to load 306M including transfer roller 105M for magenta images. Moreover, transfer bias generation circuit 350C is a circuit configured to generate the transfer bias to be supplied to load 306C including transfer roller 105C for cyan images. Transfer bias generation circuits 350K, 350Y, 350M, 350C generate the transfer biases in response to drive pulses 312K, 312Y, 312M, 312C, which are respectively supplied from output terminals OUT_K, OUT_Y, OUT_M, OUT_C of high-voltage control circuit 260, and by use of the direct-current voltage supplied from DC power source 302.

As shown in FIG. 3, transfer bias generation circuit 350K for black images includes: piezoelectric transducer 304K having a piezoelectric oscillator such as a piezoelectric ceramic plate; piezoelectric transducer drive circuit 303K configured to generate an alternating-current voltage to be supplied to a primary-side electrode of piezoelectric transducer 304K; rectifier circuit 305K configured to rectify a boosted voltage outputted from a secondary-side electrode of piezoelectric transducer 304K and to generate a substantially direct-current voltage; and voltage conversion circuit 307K configured to convert an output voltage from rectifier circuit 305K into analog voltage signal 314K. The output voltage from rectifier circuit 305K is supplied to load 306K as the transfer bias.

The other transfer bias generation circuits 350Y, 350M, 350C have the configuration as does transfer bias generation circuit 350K. Specifically, transfer bias generation circuit 350Y includes: piezoelectric transducer 304Y, piezoelectric transducer drive circuit 303Y configured to generate an alternating-current voltage to be supplied to a primary-side electrode of piezoelectric transducer 304Y; rectifier circuit 305Y configured to rectify a boosted voltage outputted from a secondary-side electrode of piezoelectric transducer 304Y and to generate a substantially direct-current voltage; and voltage conversion circuit 307Y configured to convert an output voltage from rectifier circuit 305Y into analog voltage signal 314Y. Meanwhile, transfer bias generation circuit 350M includes: piezoelectric transducer 304M; piezoelectric transducer drive circuit 303M configured to generate an alternating-current voltage to be supplied to a primary-side electrode of piezoelectric transducer 304M; rectifier circuit 305M configured to rectify a boosted voltage outputted from a secondary-side electrode of piezoelectric transducer 304M and to generate a substantially direct-current voltage; and voltage conversion circuit 307M configured to convert an output voltage from rectifier circuit 305M into analog voltage signal 314M. In addition, transfer bias generation circuit 350C includes: piezoelectric transducer 304C; piezoelectric transducer drive circuit 303C configured to generate an alternating-current voltage to be supplied to a primary-side electrode of piezoelectric transducer 304C; rectifier circuit 305C configured to rectify a boosted voltage outputted from a secondary-side electrode of piezoelectric transducer 304C and to generate a substantially direct-current voltage; and voltage conversion circuit 307C configured to convert an output voltage from rectifier circuit 305C into analog voltage signal 314C.

Each of piezoelectric transducer drive circuits 303K, 303Y, 303M, 303C includes a switching element such as a power MOSFET (metal-oxide semiconductor field-effect transistor), which is configured to generate the alternating-current voltage in response to a corresponding one of the supplied drive pulses 312K, 312Y, 312M, 312C.

High-voltage control circuit 260 is a digital circuit configured to execute digital operation in synchronism with a clock signal supplied from quartz crystal oscillator 419. Printer engine controller 253 controls high-voltage control circuit 260 by providing high-voltage control circuit 260 with output control signal 310, data signals 311K, 311Y, 311M, 311C, and reset signal 309. Data signals 311K, 311Y, 311M, 311C are 8-bit parallel signals which indicate target values corresponding to target voltages to be supplied to loads 306K, 306Y, 306M, 306C, respectively. High-voltage control circuit 260 includes input terminals AIN_K, AIN_Y, AIN_M, AIN_C to which analog voltage signals 314K, 314Y, 314M, 314C are respectively inputted. Analog voltage signals 314K, 314Y, 314M, 314C are used for the control configured to cause the output voltages to loads 306K, 306Y, 306M, 306C to follow the target voltages. Moreover, high-voltage control circuit 260 includes registers (not shown) configured to hold various set values as described later, and printer engine controller 253 is capable of providing the registers with the set values to be held therein via serial communication unit 340.

Figure 4:
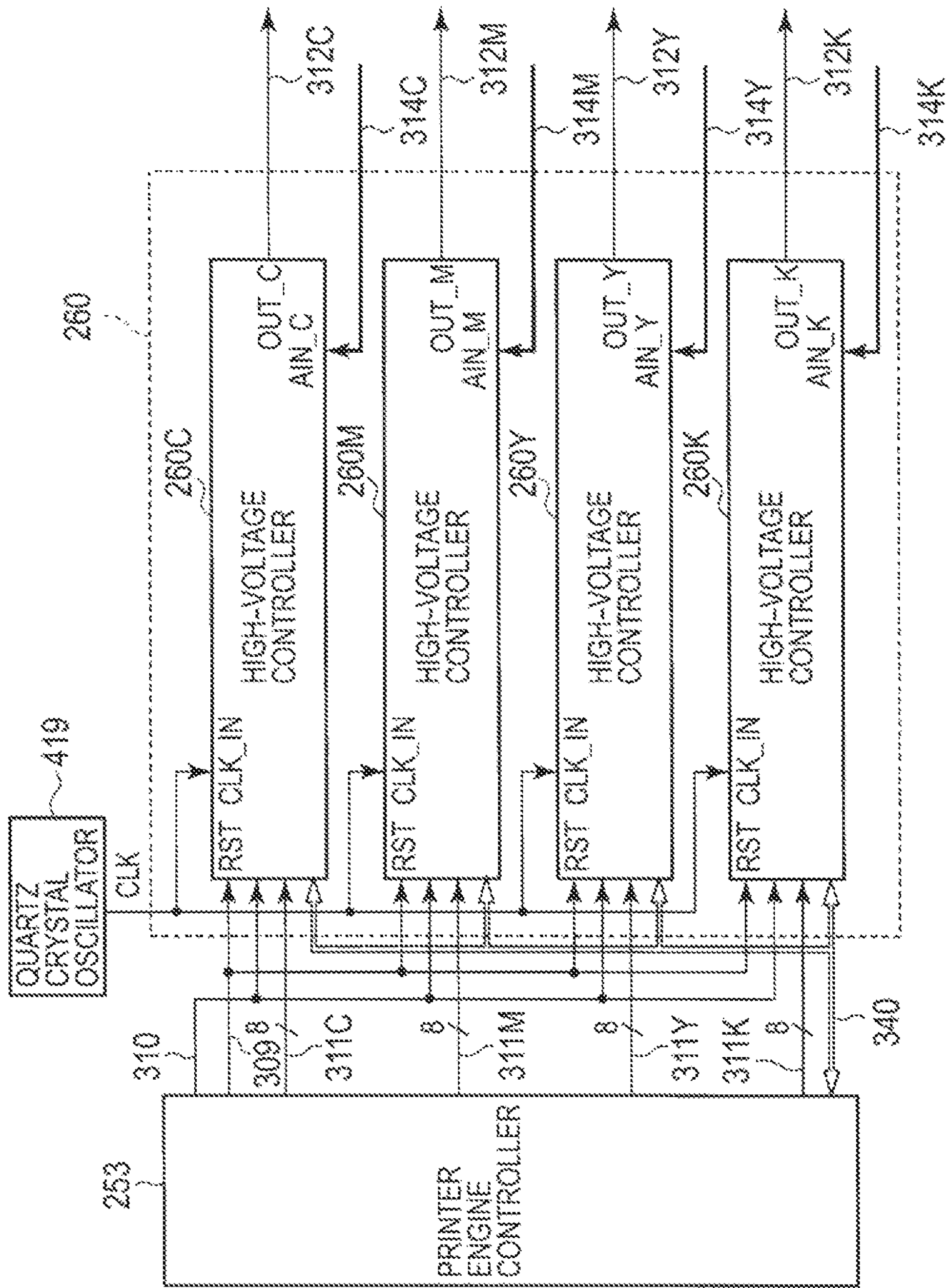
FIG. 4 is a functional block diagram showing a schematic configuration of a high-voltage control circuit of the first embodiment.

FIG. 4 is a functional block diagram showing a schematic configuration of high-voltage control circuit 260. As shown in FIG. 4, high-voltage control circuit 260 includes high-voltage controller 260K for black images, high-voltage controller 260Y for yellow images, high-voltage controller 260M for magenta images, and high-voltage controller 260C for cyan images. High-voltage controllers 260K, 260Y, 260M, 260C receive data signals 311K, 311Y, 311M, 311C, respectively from printer engine controller 253, and are connected to printer engine controller 253 via serial communication unit 340.

Figure 5:
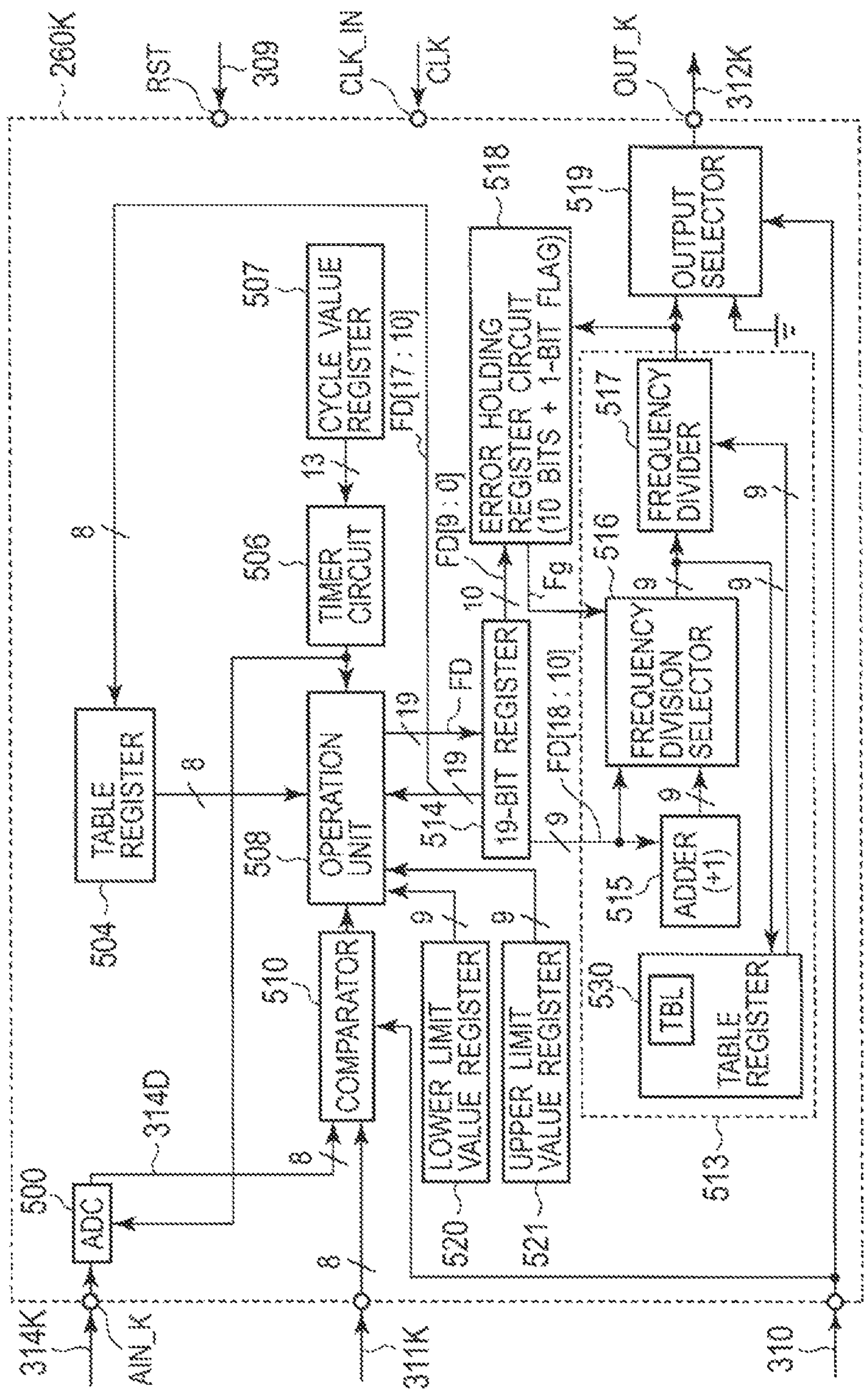
FIG. 5 is a diagram schematically showing a basic configuration of a high-voltage controller of the first embodiment.
Figure 6:
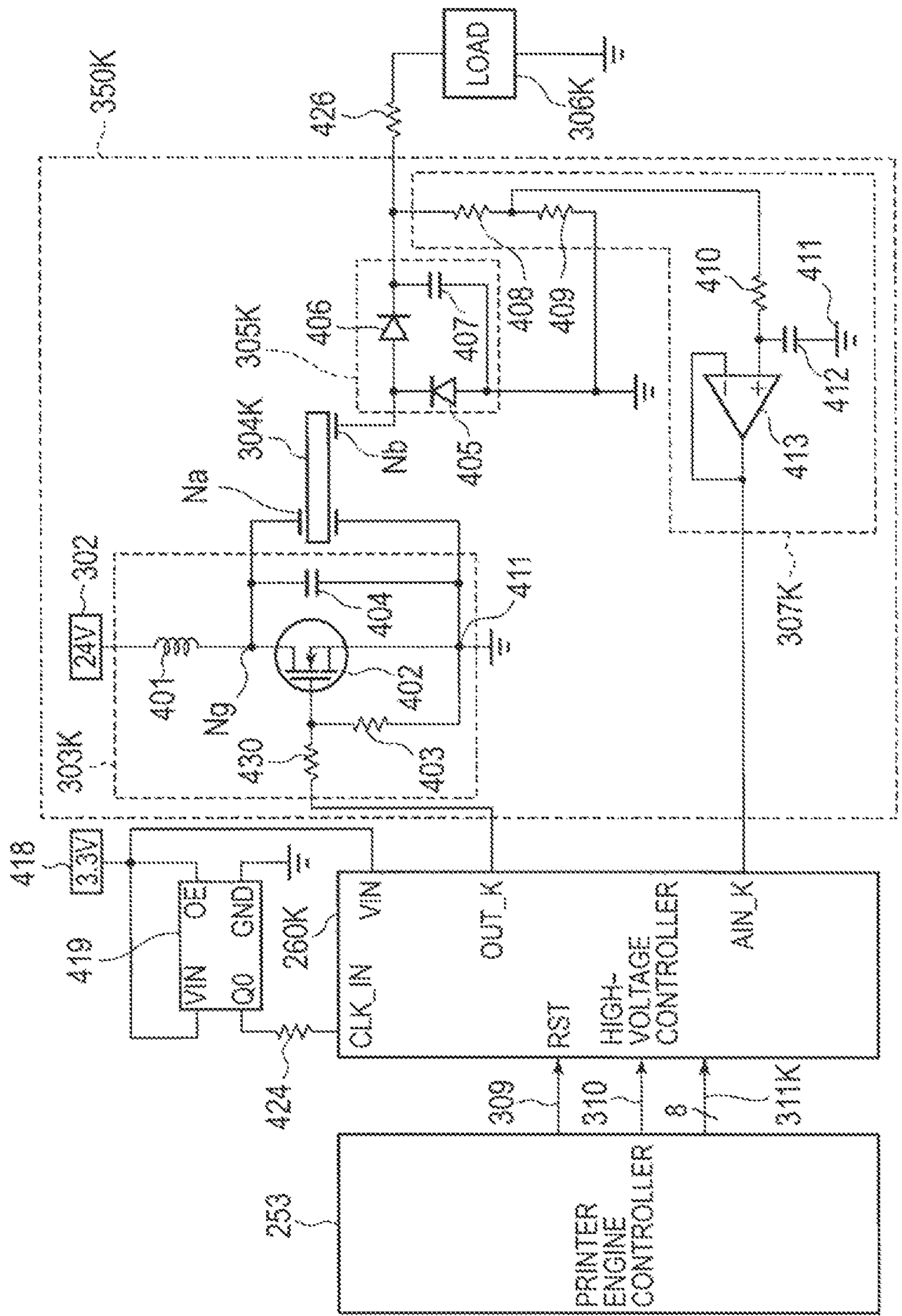
FIG. 6 is a diagram schematically showing an example of a basic configuration of a transfer bias generation circuit of the first embodiment.

FIG. 5 is a diagram schematically showing a basic configuration of high-voltage controller 260K of the first embodiment. Basic configurations of the other high-voltage controllers 260Y, 260M, 260C are identical to the basic configuration shown in FIG. 5. Meanwhile, FIG. 6 is a diagram schematically showing an example of a basic configuration of transfer bias generation circuit 350K corresponding to high-voltage controller 260K of the first embodiment. The other transfer bias generation circuits 350Y, 350M, 350C also have the same configuration as does transfer bias generation circuit 350K in FIG. 6.

As shown in FIG. 6, high-voltage controller 260K includes clock input terminal CLK_IN into which a reference clock (hereinafter simply referred to as a "clock") is inputted from quartz crystal oscillator 419 via resistance element 424. Quartz crystal oscillator 419 includes voltage input terminal VIN, output enable terminal OE, clock output terminal Q0, and ground terminal GND. A drive voltage of 3.3 volts is supplied from power source 418 to both of voltage input terminal VIN and output enable terminal OE. In this embodiment, quartz crystal oscillator 419 is capable of outputting a clock at 50 MHz from clock output terminal Q0 in response to the drive voltage of 3.3 volts. High-voltage controller 260K is operated in synchronism with this clock. Moreover, high-voltage controller 260K generates a drive pulse having a variable on-duty ratio (a ratio of a high-level period to one cycle) by dividing the frequency of the clock, and outputs the drive pulse from output terminal OUT_K.

Transfer bias generation circuit 350K includes piezoelectric transducer drive circuit 303K, which is configured to generate the alternating-current voltage to be supplied to the primary-side electrode of piezoelectric transducer 304K in response to the drive pulse supplied from output terminal OUT_K of high-voltage controller 260K. Piezoelectric transducer drive circuit 303K includes power MOSFET 402 serving as the switching element, resistance elements 430, 403, inductor (coil) 401, and capacitor 404. One end of inductor 401 is connected to DC power source 302 configured to supply the direct-current voltage of 24 volts. The other end of inductor 401 is connected to a drain electrode of power MOSFET 402, to one end of capacitor 404, and to the primary-side electrode (node Na) of piezoelectric transducer 304K via node Ng. Moreover, both of a source electrode of power MOSFET 402 and the other end of capacitor 404 are connected to ground terminal 411. In addition, a gate electrode of power MOSFET 402 is connected to output terminal OUT_K of high-voltage controller 260K via resistance element 430. Resistance element 403 is connected between the gate electrode and ground terminal 411.

Inductor 401, capacitor 404, and piezoelectric transducer 304K collectively constitute a resonance circuit. An alternating-current voltage formed into a half sine wave is applied to the primary-side electrode (an input-side electrode) of piezoelectric transducer 304K by an operation of this resonance circuit. Piezoelectric transducer 304K outputs a high alternating-current voltage from the secondary-side electrode. Here, the high alternating-current voltage corresponds to a switching frequency of the drive pulse applied to the gate electrode of power MOSFET 402. The alternating-current voltage thus outputted is rectified by rectifier circuit 305K, and is thereby converted into the direct-current voltage.

As shown in FIG. 6, rectifier circuit 305K includes high-voltage rectifier diodes 405, 406, and capacitor 407. Both of the anode of high-voltage rectifier diode 405 and one end of capacitor 407 are grounded. Meanwhile, the cathode of high-voltage rectifier diode 405 is connected to both of node Nb and the anode of high-voltage rectifier diode 406. Moreover, the cathode of high-voltage rectifier diode 406 is connected to the other end of capacitor 407. The alternating-current voltage outputted from piezoelectric transducer 304K is rectified by high-voltage rectifier diodes 405, 406, and formed into a positive bias, and is then smoothed by capacitor 407.

Figure 7:
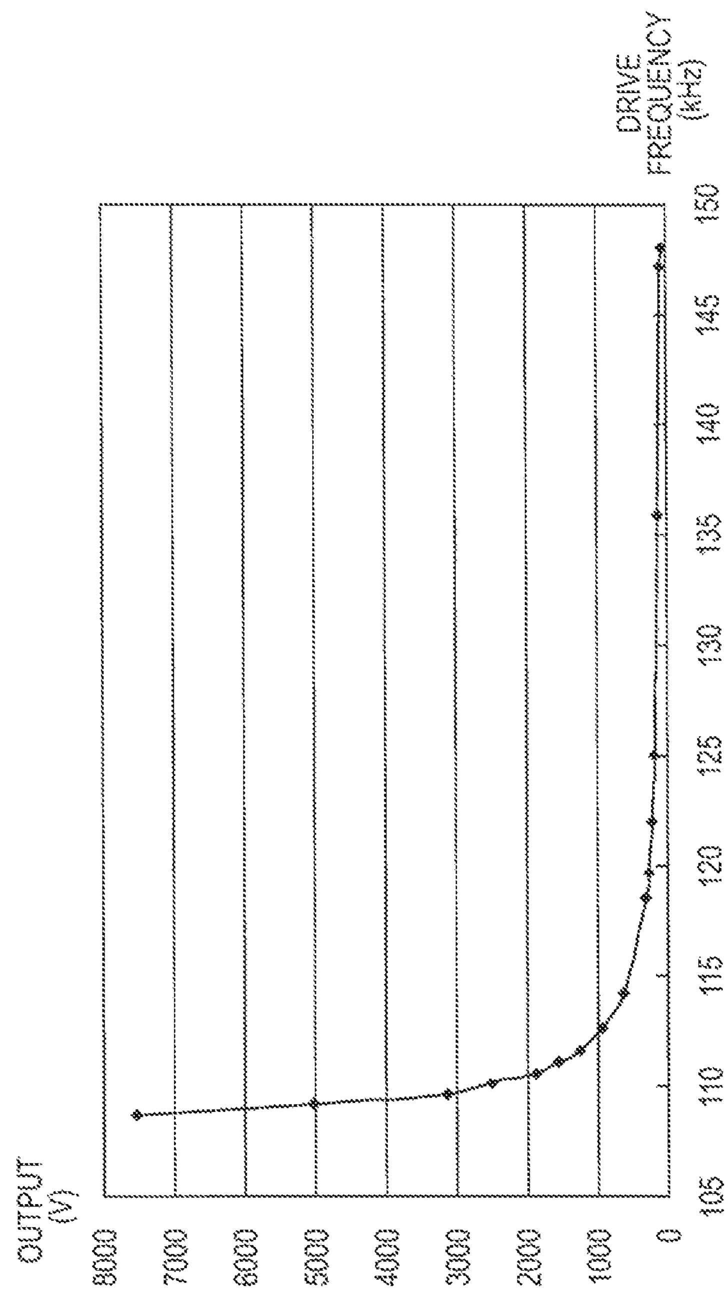
FIG. 7 is a graph showing an example of a relationship (an output characteristic) between a frequency (a drive frequency) of an alternating-current voltage to be inputted into a piezoelectric transducer of the first embodiment and an output voltage therefrom.

Piezoelectric transducer 304K has resonance frequency f0 that is unique to a piezoelectric vibrator such as a piezoelectric ceramic plate. When the frequency of the alternating-current voltage inputted into node Na is equal or close to resonance frequency f0, piezoelectric transducer 304K is configured to generate an alternating-current voltage (a boosted voltage), which has a higher amplitude than the amplitude of the inputted alternating-current voltage, at node Nb of the secondary-side electrode. Besides resonance frequency f0, piezoelectric transducer 304K may also have an unnecessary resonance frequency, i.e., a spurious frequency, which is higher than resonance frequency f0. FIG. 7 is a graph showing an example of a relationship (an output characteristic) between the frequency (a drive frequency) of the alternating-current voltage to be inputted into piezoelectric transducer 304K of this embodiment and the output voltage therefrom. Note that the output characteristic in FIG. 7 is a mere example, and that the output characteristics (the amplitude of the output voltage and the resonance frequency) of piezoelectric transducer 304K vary with a change in the impedance of the load or with an amount of current flowing through the load.

An output from rectifier circuit 305K is supplied to load 306K via resistance element 426 and also to voltage conversion circuit 307K at the same time. As shown in the example in FIG. 6, voltage conversion circuit 307K includes: resistance elements 408, 409 constituting a voltage division circuit; a set of resistance element 410 and capacitor 412 constituting a RC filter; and operational amplifier 413 constituting a voltage follower circuit. For example, the resistance of resistance element 408 can be set at 100 MΩ ($=100\times10^6\Omega$) while the resistance of resistance element 409 can be set at 33 kΩ ($=33\times10^3\Omega$). At this time, the frequency of a high voltage outputted from rectifier circuit 305K is divided by resistance elements 408, 409 with a proportion of 3.3 to 10000, smoothed by the set of resistance element 410 and capacitor 412, then impedance-converted by operational amplifier 413, and inputted into input terminal AIN_K for A/D conversion provided at high-voltage controller 260K.

Next, high-voltage controller 260K is described by referring to FIG. 5.

As shown in FIG. 5, high-voltage controller 260K includes A/D converter (ADC) 500, comparator 510, operation unit 508, table register (look-up table) 504, timer circuit 506, cycle value register 507, 19-bit register 514, pulse generation circuit 513, error holding register circuit 518, output selector 519, and registers 520, 521. A frequency controller of the invention can be formed of operation unit 508, 19-bit register 514, and table register 504, for example.

ADC 500 has an 8-bit resolution configured to convert analog voltage signal 314K inputted into input terminal AIN_K into 8-bit digital voltage signal 314D. Digital voltage signal 314D represents a value (hereinafter referred to as an actual measurement value) corresponding to an output voltage from transfer bias generation circuit 350K. On the other hand, data signal 311K inputted from printer engine controller 253 represents a target value corresponding to a target voltage. Comparator 510 performs a comparison operation when a logic level of inputted output control signal 310 is at a H level (high level). Specifically, comparator 510 outputs a 1-bit signal indicating that the logic level is at the H level, when the actual measurement value is below the target value; and comparator 510 outputs a 1-bit signal indicating that the logic level is at a L level (low level), when the actual measurement value is equal to or above the target value. Operation unit 508 is capable of determining whether or not the output voltage from transfer bias generation circuit 350K is below the target voltage depending on whether the logic level of the output from comparator 510 is at the L level or the H level.

Figure 8:
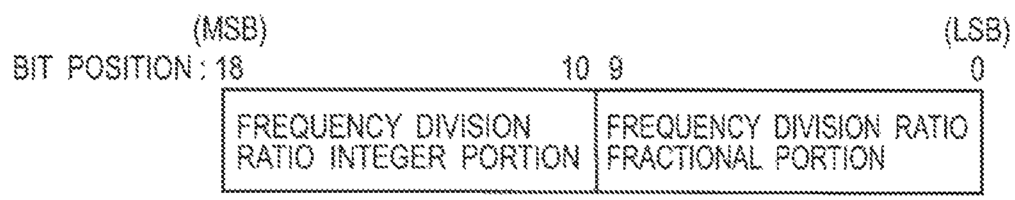
FIG. 8 is a diagram showing a format of frequency division ratio data of the first embodiment.

Operation unit 508 has a function to generate 19-bit frequency division data FD to be held by 19-bit register 514. FIG. 8 is a diagram showing a format of frequency division data FD. Frequency division data FD includes: 10-least-significant-bit FD [9:0] called a frequency division ratio fractional portion; and 9-most significant-bit FD [18:10] called a frequency division ratio integer portion.

Table register 504 is a LUT (look-up table) configured to accept an input of 8-least-significant-bit FD [17:10] of the frequency division ratio integer portion stored in 19-bit register 514, and to output an 8-bit value corresponding to this inputted value to operation unit 508. FIG. 9 and FIG. 10 are tables showing correspondence relationship between inputted values and outputted values in table register 504. In FIG. 9 and FIG. 10, the inputted values and the outputted values are expressed in hexadecimal numbers each with a suffix of "hex". In addition, values of the frequency division ratio integer portion corresponding to the inputted values are also expressed in hexadecimal numbers.

Timer circuit 506 has a function to count in synchronism with clock CLK inputted into clock input terminal CLK_IN, and holds a counted value. Specifically, as an initial value, a 13-bit count cycle value is given from cycle value register 507 to timer circuit 506. Timer circuit 506 sets this count cycle value as the counted value, and decrements (subtracts) the counted value at each pulse edge (a rise edge or a fall edge) of clock CLK. When the counted value reaches the value "0," the counted value is re-set to the count cycle value being the initial value. Timer circuit 506 outputs a pulse signal containing a pulse edge (a rise edge or a fall edge) to operation unit 508 and to ADC 500 every time the counted value reaches the value "0." The count cycle value can be set in such a manner that the cycle of the pulse signal is 140 microseconds, for example. However, without limitation to the foregoing, the count cycle value may be set in such a manner that the cycle of the pulse signal is in a range of several tens of microseconds to one hundred and several tens of microseconds. ADC 500 executes A/D conversion in accordance with the cycle of this pulse signal.

Operation unit 508 adds an 8-bit outputted value from table register 504 to a current value (a 19-bit value) of frequency division ratio data FD and thus generates new frequency division ratio data, every time operation unit 508 receives the pulse from timer circuit 506. Subsequently, operation unit 508 replaces frequency division ratio data FD held by 19-bit register 514 with the new frequency division ratio data, and thus updates the data held by 19-bit register 514.

Lower limit value FDs of frequency division ratio integer portion FD [18:10] is stored in lower limit value register 520, and upper limit value FDe of frequency division ratio integer portion FD [18:10] is stored in upper limit value register 521. Operation unit 508 performs control on the value of frequency division ratio integer portion FD [18:10] in such a manner that the value of frequency division ratio integer portion FD [18:10] falls within a numerical value range of lower limit value FDs to upper limit value FDe.

As shown in FIG. 5, pulse generation circuit 513 includes adder 515, frequency division selector 516, frequency divider 517, and table register 530. Adder 515 increases 9-bit value FD [18:10] outputted from 19-bit register 514 by a given value (such as "1"), and provides frequency division selector 516 with the added value.

Frequency division selector 516 selects either 9-bit frequency division ratio integer portion FD [18:10] or the output from adder 515 depending on the logic level of flag signal Fg outputted from error holding register circuit 518, and outputs the selected value to frequency divider 517 and table register 530.

Table register 530 is a circuit configured to accept the 9-bit output from frequency division selector 516 as an input, to select a 9-bit value corresponding to this inputted value based on look-up table TBL, and to output the selected value to frequency divider 517 as a control value. FIG. 11 is a diagram showing correspondence relationships between the inputted values and the outputted values stored in look-up table TBL in table register 530.

Frequency divider 517 generates the drive pulse by dividing the frequency of clock CLK while defining the 9-bit outputted value from frequency division selector 516 as a frequency division ratio. Moreover, frequency divider 517 is capable of changing the on-duty ratio of the drive pulse by selecting a pulse width of the drive pulse based on the control value inputted from table register 530. Specifically, frequency divider 517 is capable of generating a drive pulse having a cycle which is proportional to the 9-bit outputted value from frequency division selector 516 and having the pulse width which is proportional to the control value by use of a built-in counter. Frequency division selector 516 selects 9-bit value FD [18:10] when the logic level of flag signal Fg is at the L level, and selects the 9-bit output from adder 515 when the logic level of flag signal Fg is at the H level.

Output selector 519 selects the drive pulse outputted from frequency divider 517 when the logic level of output control signal 310 is at the H level, and outputs this drive pulse 312K from output terminal OUT_K to transfer bias generation circuit 350K. On the other hand, output selector 519 selects a ground voltage when the logic level of output control signal 310 is at the L level.

Error holding register circuit 518 includes: a 10-bit error storage area in which frequency division ratio fractional portion FD [9:0] is captured out of the frequency division ratio data in 19-bit register 514 and is stored as an error; and a flag storage area used to store 1-bit flag signal Fg. At each edge (a rise edge or a fall edge) of the drive pulse outputted from frequency divider 517 of pulse generation circuit 513, error holding register circuit 518 captures frequency division ratio fractional portion FD [9:0] inputted from 19-bit register 514, adds captured frequency division ratio fractional portion FD [9:0] to the error held in the error storage area, and stores a result of the addition in the error storage area as a cumulative error (an accumulated value). Once the cumulative error exceeds a threshold and overflows the error storage area, error holding register circuit 518 sets the logic level of flag signal Fg to the H level. In this case, because the cumulative error overflows the error storage area, the cumulative error takes a value smaller than immediately before the overflow. Then, the logic level of flag signal Fg is returned to the L level when the next pulse edge is inputted into error holding register circuit 518.

As described above, frequency division ratio integer portion FD [18:10] is inputted from 19-bit register 514 into frequency divider 517 via frequency division selector 516 while the logic level of flag signal Fg remains at the L level. Frequency divider 517 generates the drive pulse by dividing the frequency of clock CLK while defining the value of frequency division ratio integer portion FD [18:10] as the frequency division ratio. Frequency division ratio fractional portion FD [9:0] is not used by divider 517 during this period, and is therefore accumulated as the error in the error storage area in error holding register circuit 518.

On the other hand, when the cumulative error (the accumulated value) exceeds the threshold and overflows the error storage area and the logic level of flag signal Fg is set to the H level, frequency divider 517 generates the drive pulse by dividing the frequency of clock CLK while defining the outputted value from adder 515 as the frequency division ratio. Thus, pulse generation circuit 513 is capable of defining frequency division ratio fractional portion FD [9:0] occurring at certain time t0 as the error, and adding (spread) this error to frequency division ratio integer portion FD [18:10] occurring at different time t1 (≠t0). Thereby, high-voltage controller 260K of this embodiment is capable of controlling the drive frequency applicable to piezoelectric transducer 304K at a higher resolution than the 9-bit resolution.

Next, the operation of image formation apparatus 100 of the first embodiment is described in detail.

First, once image formation apparatus 100 is turned on, control circuit 200 causes image formation apparatus 100 to start initial operation. Specifically, printer engine controller 253 of control circuit 200 in FIG. 2 causes belt motor 256 to rotate drive roller 106 in order to drive transfer belt 108, and causes drum motor 258 to rotate photosensitive drums 132K, 132Y, 132M, 132C. At this time, printer engine controller 253 controls high-voltage control circuit 260, and thereby causes charge bias generator 261, development bias generator 262, and transfer bias generator 263, respectively, to generate the voltages. Here, high-voltage controllers 260K, 260Y, 260M, 260C in FIG. 4 supply drive pulses 312K, 312Y, 312M, 312C respectively to transfer bias generation circuits 350K, 350Y, 350M, 350C in FIG. 3, and thus drive the piezoelectric transducers inside transfer bias generation circuits 350K, 350Y, 350M, 350C in an idle state. In other words, the piezoelectric transducers are subjected to aging. Thereby, the characteristic of each piezoelectric transducer can be stabilized by raising the temperature of the piezoelectric vibrator such as the piezoelectric ceramic plate constituting the piezoelectric transducer.

Thereafter, once print data described in a format of PDL or the like is inputted into image processor 251 via host interface 250 in FIG. 2, image processor 251 generates bitmap data (image data) based on the inputted print data, and outputs the bitmap data to LED head interface 252 and to printer engine controller 253. Printer engine controller 253 controls the operation of fixation unit heater 151, and thus heats fixation roller 118A. Once the temperature detected by thermistor 150 reaches a predetermined temperature, printer engine controller 253 causes image formation apparatus 100 to start image formation operation.

First, hopping motor 254 rotates hopping roller 114. Thus, record medium 110 is taken out of cassette 113, and guided to resist rollers 116, 117. Because resist motor 255 rotates resist rollers 116, 117, record medium 110 taken out of cassette 113 is passed through medium detection sensor 140, and loaded onto transfer belt 108 by means of resist rollers 116, 117. Transfer belt 108 passes record medium 110 immediately below development units 102K, 102Y, 102M, 102C sequentially at a predetermined transport speed.

At this time, printer engine controller 253 individually controls the timings at which development units 102K, 102Y, 102M, 102C should be operated based on the detection result by medium detection sensor 140 and the transport speed of record medium 110. In development units 102K, 102Y, 102M, 102C, charge rollers 136K, 136Y, 136M, 136C evenly charge the surfaces of photosensitive drums 132K, 132Y, 132M, 132C, respectively. Meanwhile, LED heads 103K, 103Y, 103M, 103C emit light in accordance with the patterns corresponding to the bitmap data, and expose photosensitive drums 132K, 132Y, 132M, 132C to the light, thereby forming the electrostatic latent images on the surfaces of photosensitive drums 132K, 132Y, 132M, 132C, respectively. Development rollers 134K, 134Y, 134M, 134C respectively attach the developers to the electrostatic latent images on photosensitive drums 132K, 132Y, 132M, 132C, thereby forming the developer images. Then, transfer rollers 105K, 105Y, 105M, 105C receive application of the transfer biases respectively from transfer bias generation circuits 350K, 350Y, 350M, 350C in FIG. 3, and transfer the developer images in four colors (black, yellow, magenta, and cyan) located on photosensitive drums 132K, 132Y, 132M, 132C to the surface of record medium 110 on transfer belt 108. Thereafter, fixation unit 118 fixes the developer images in the four colors onto record medium 110, and then discharges record medium 110 to guide member 119.

Next, the operation of high-voltage power supply device 301 is described in detail.

As shown in FIG. 3 and FIG. 4, high-voltage power supply device 301 includes transfer bias generation circuits 350K, 350Y, 350M, 350C and high-voltage controllers 260K, 260Y, 260M, 260C corresponding to the four channels. It is to be noted, however, that: the transfer bias generation circuits 350K, 350Y, 350M, 350C have the same basic configuration; and high-voltage controllers 260K, 260Y, 260M, 260C also have the same basic configuration, as described previously. For this reason, the operation of high-voltage controller 260K and the operation of transfer bias generation circuit 350K for black images are mainly described below.

Once image formation apparatus 100 is turned on, printer engine controller 253 resets high-voltage control circuit 260 (sets the circuit to an initial state) by inputting L-level reset signal 309 to reset terminal RST of high-voltage control circuit 260. In high-voltage control circuit 260, the values in the various registers are reset in response to L-level reset signal 309.

Next, printer engine controller 253 supplies data signals 311K, 311Y, 311M, 311C, each of which is an 8-bit signal, respectively to high-voltage controllers 260K, 260Y, 260M, 260C in FIG. 4. Data signals 311K, 311Y, 311M, 311C represent target values in a range of 00hex to FFhex corresponding to target voltages in a range of 0 V to 10 kV, for example. At the time of the initial operation of image formation apparatus 100, printer engine controller 253 supplies data signals 311K, 311Y, 311M, 311C equivalent to target value 00hex in order to drive the piezoelectric transducers in an idle state. At the time of image formation after the completion of the initial operation, printer engine controller 253 supplies data signals 311K, 311Y, 311M, 311C representing the respective target values in a range of 1Ahex to CChex corresponding to the target voltages (from 1 kV to 8 kV, for example) necessary for transferring the developer images located on photosensitive drums 132K, 132Y, 132M, 132C.

Meanwhile, printer engine controller 253 sets the logic level of output control signal 310 to the H level at a predetermined timing in the period when drive transfer belt 108 is started to drive at the time of the initial operation of image formation apparatus 100. In addition, printer engine controller 253 also sets the logic level of output control signal 310 to the H level at a predetermined timing in order to transfer the developer images when record medium 100 is passed through each of a region (a nipped portion) between transfer roller 105K and photoconductor drum 132K, a region (a nipped portion) between transfer roller 105Y and photoconductor drum 132Y, a region (a nipped portion) between transfer roller 105M and photoconductor drum 132M, and a region (a nipped portion) between transfer roller 105C and photoconductor drum 132C. At this time, printer engine controller 253 is capable of calculating the time when record medium 110 reaches each of the nipped portions of the development units 102K, 102Y, 102M, 102C based on the detection result by medium detection sensor 140 and the transport speed of record medium 110.

High-voltage control circuit 260 starts outputting drive pulses 312K, 312Y, 312M, 312C from output terminals OUT_K, OUT_Y, OUT_M, and OUT_C as soon as the logic level of output control signal 310 is changed to the H level. Piezoelectric transducer drive circuits 303K, 303Y, 303M, 303C perform switching operation relative to DC power source 302 in response to drive pulses 312K, 312Y, 312M, 312C, and apply the half sine wave positive voltages to the primary-side electrodes of piezoelectric transducers 304K, 304Y, 304M, 304C. Accordingly, sine wave (alternating-current) converted voltages are outputted from the secondary-side electrodes of piezoelectric transducers 304K, 304Y, 304M, 304C. Rectifier circuits 305K, 305Y, 305M, 305C rectify and smooth the inputted alternating-current converted voltages, thereby generating the output voltages. The output voltages are applied to shafts of transfer rollers 105K, 105Y, 105M, 105C constituting loads 306K, 306Y, 306M, 306C.

In the meantime, voltage conversion circuits 307K, 307Y, 307M, 307C convert the amplitudes of the output voltages into analog voltage signals 314K, 314Y, 314M, 314C having amplitudes in a range of 0 V to 3.3 V, for example, and then input analog voltage signals 314K, 314Y, 314M, 314C respectively to input terminals AIN_K, AIN_Y, AIN_M, AIN_C for A/D conversion provided to high-voltage control circuit 260. High-voltage control circuit 260 converts analog voltage signals 314K, 314Y, 314M, 314C into digital voltage signals, and uses the digital voltage signals for drive frequency control configured to cause the output voltages to follow the target voltages.

In high-voltage controller 260K, comparator 510 in FIG. 5 outputs a H-level signal to operation unit 508 when the actual measurement value represented by digital voltage signal 314D is smaller than the target value (actual measurement value<target value). In this case, operation unit 508 increases the value of 19-bit FD [18:0] of frequency division ratio data FD stepwise by using the 8-bit output from table register 504. Accordingly, pulse generation circuit 513 outputs the drive pulse having the switching frequency that is lowered stepwise. As a consequence, the drive frequency is lowered stepwise. As shown in FIG. 7, the lower voltage is outputted as the drive frequency becomes higher.

Comparator 510 in FIG. 5 outputs an L-level signal to operation unit 508 when the actual measurement value is equal to or above the target value (actual value target value). In this case, operation unit 508 decreases the value of 19-bit FD [18:0] of frequency division ratio data FD stepwise by using the 8-bit output from table register 504. Accordingly, pulse generation circuit 513 outputs the drive pulse having the switching frequency that is raised stepwise. As a consequence, the drive frequency is gradually raised. Thereafter, once the actual measurement value falls below the target value, operation unit 508 increases the value of 19-bit FD [18:0] of frequency division ratio data FD stepwise. Accordingly, the drive frequency is gradually lowered. In this way, after the output voltage reaches the target voltage, the drive frequency is changed in such a manner as to cause the output voltage to follow the target voltage. As described previously, pulse generation circuit 513 of this embodiment accumulates frequency division ratio fractional portion FD [9:0] as the error, and temporarily increases the value of frequency division ratio integer portion FD [18:10] when the cumulative error exceeds the threshold. Thus, the pulse generation circuit 513 is capable of controlling the drive frequency at the higher resolution than the resolution which is realized only by use of frequency division ratio integer portion FD [18:10]. As a consequence, high-voltage controller 260K is capable of stabilizing the output voltage at a constant voltage.

For example, let us assume a case in which: the 19-bit values to be stored in 19-bit register 514 do not change during a $2^{10}$-pulse period (=1024-pulse period) of the output from frequency divider 517; and an overflow occurs once in the 1024-pulse period. In this case, an average value of the 9-bit frequency division ratio values to be outputted from frequency division selector 516 is approximately equal to FDi+FDd/1024, where: FDi denotes the value of frequency division ratio integer portion FD [18:10]; and FDd denotes the value of frequency division ratio fractional portion FD [9:0].

Let us assume a more general case in which: the 19-bit values to be stored in 19-bit register 514 do not change during the $2^{10}$-pulse period (=1024-pulse period); and overflows occur K (=1024-M) times in the 1024-pulse period. In this respect, M is a non-negative integer equal to or below 1024. In this case, the average value of the 9-bit frequency division ratio values to be outputted from frequency division selector 516 is expressed by the following formula:

$$\{\mathrm{FDi}\times M+(\mathrm{FDi}+1)\times(1024-M)\}/1024=\mathrm{FDi}+K/1024.$$

Here, K can be considered to be approximately equal to the value of the 10 least significant bits of frequency division data FD, namely, the value of frequency division ratio fractional portion FD [9:0]. This formula defines a result in the case where the 19-bit value (the value of frequency division ratio data FD) stored in 19-bit register 507 does not change. However, even when the 19-bit value changes in the 1024-pulse period, it is confirmed that the average value per unit time of the left-hand side of the formula is approximately equal to the average value per unit time of FDi+FDd/1024. Accordingly, pulse generation circuit 513 of this embodiment reflects value FDd of frequency division ratio fractional portion FD [9:0] in the average value of the frequency division ratio values. For this reason, pulse generation circuit 513 is capable of controlling the drive frequency at the higher resolution than in the case of using only the value FDi of frequency division ratio integer portion FD [18:10].

FIG. 12 is a table showing examples of values of the output voltages corresponding to the drive frequencies. The values of frequency division ratio integer portion FD [18:10] corresponding to the drive frequencies are also shown in hexadecimal numbers in FIG. 12.

Figure 13:
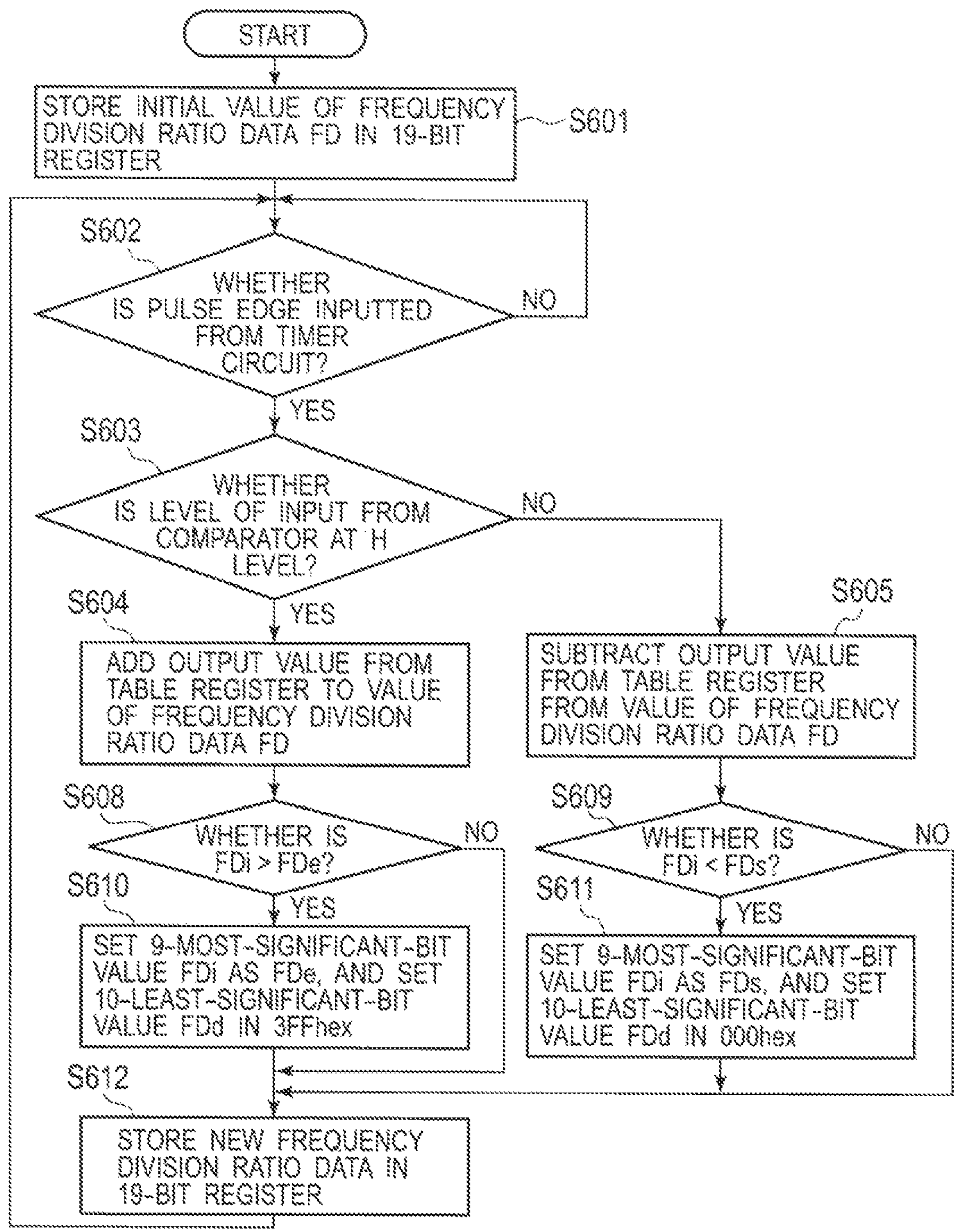
FIG. 13 is a flowchart schematically showing procedures of a control method by an operation unit of the first embodiment.
Figure 14A:
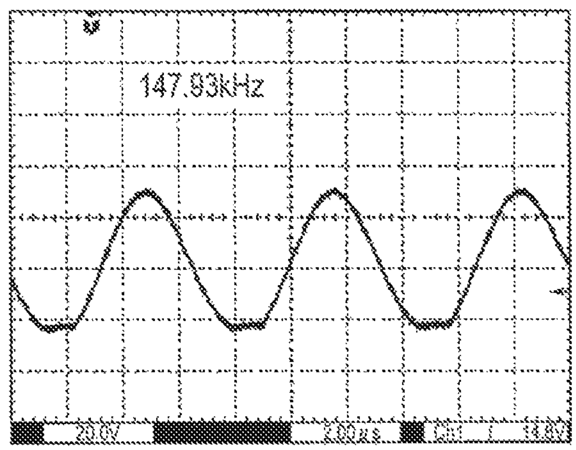
FIGS. 14A to 14C are diagrams of measurement results showing relationships between drive frequencies and drain voltages (electric potentials at node Ng) of a power MOSFET.
Figure 14B:
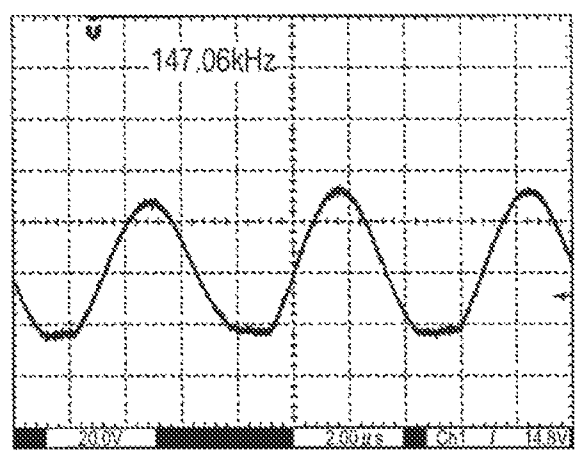
Figure 14C:
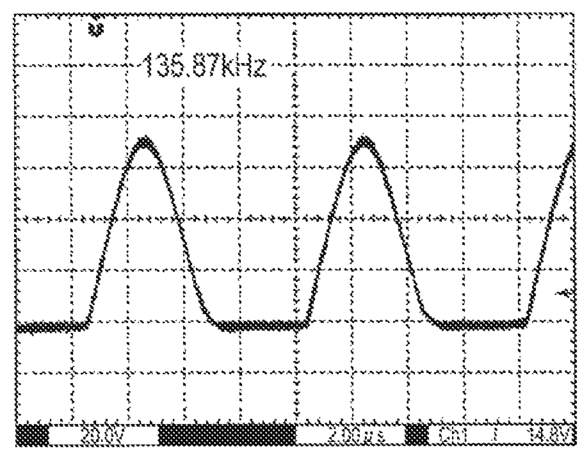
Figure 15A:
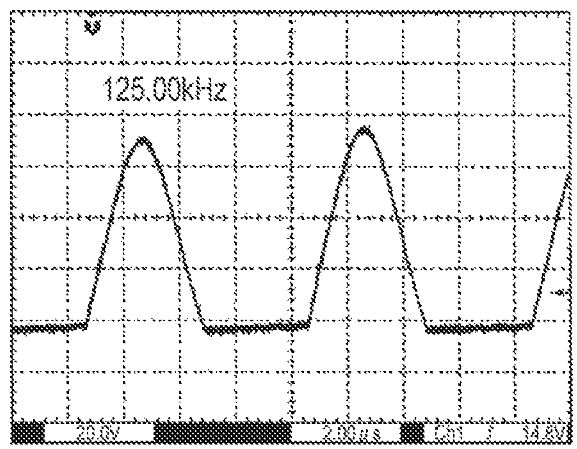
FIGS. 15A to 15C are more diagrams of measurement results showing relationships between drive frequencies and drain voltages (electric potentials at node Ng) of the power MOSFET.
Figure 15B:
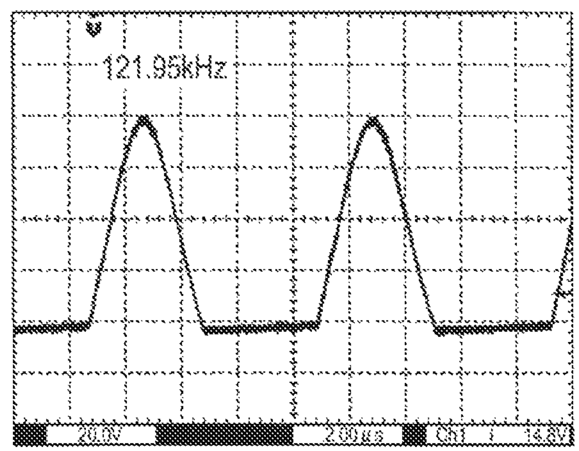
Figure 15C:
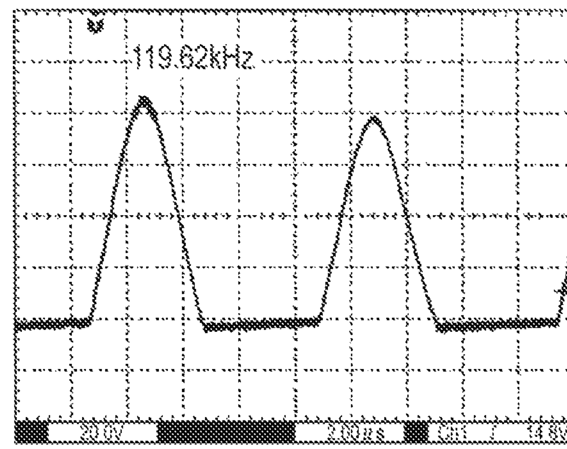
Figure 16A:
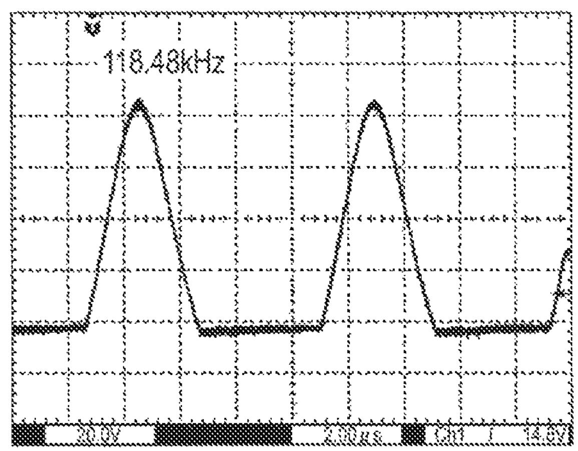
FIGS. 16A to 16C are still more diagrams of measurement results showing relationships between drive frequencies and drain voltages (electric potentials at node Ng) of the power MOSFET.
Figure 16B:
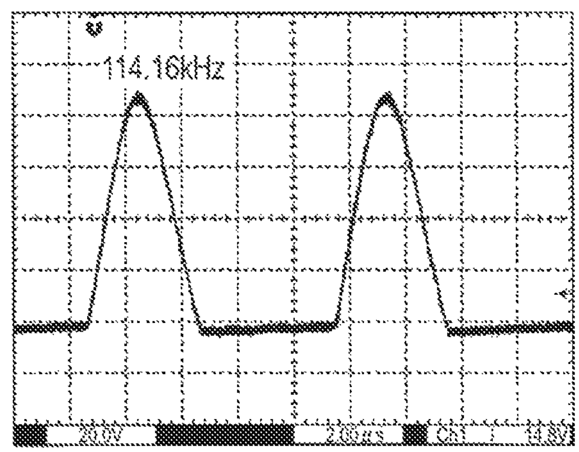
Figure 16C:
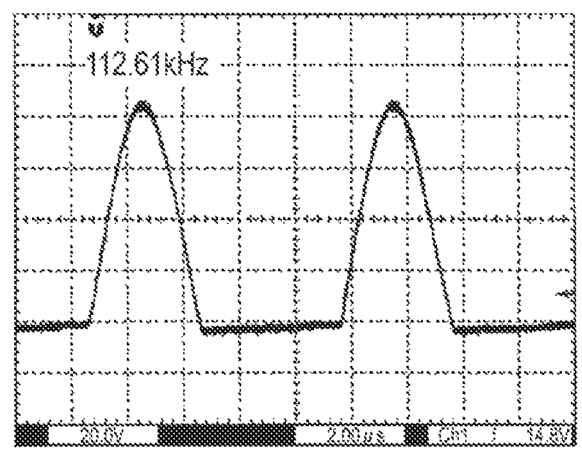
Figure 17A:
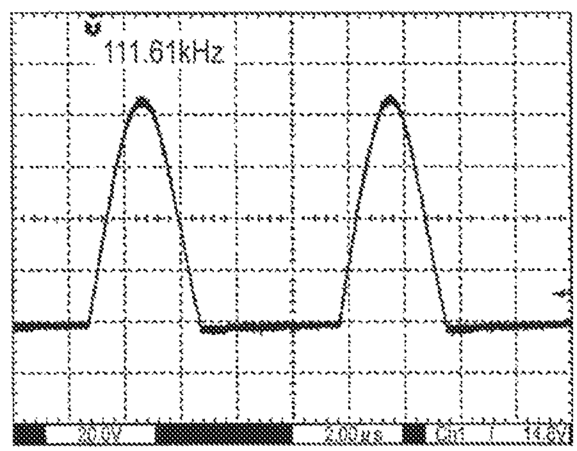
FIGS. 17A to 17C are additional diagrams of measurement results showing relationships between drive frequencies and drain voltages (electric potentials at node Ng) of the power MOSFET.
Figure 17B:
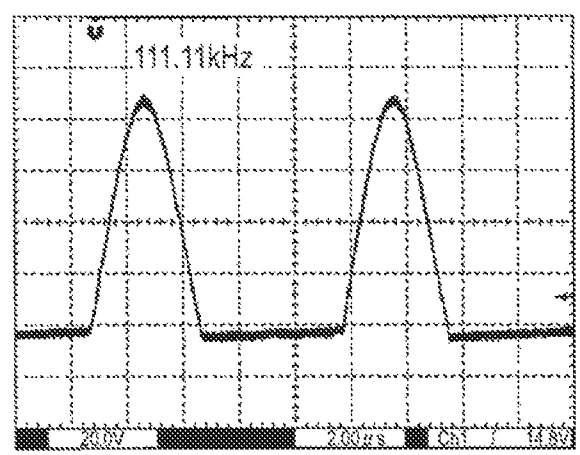
Figure 17C:
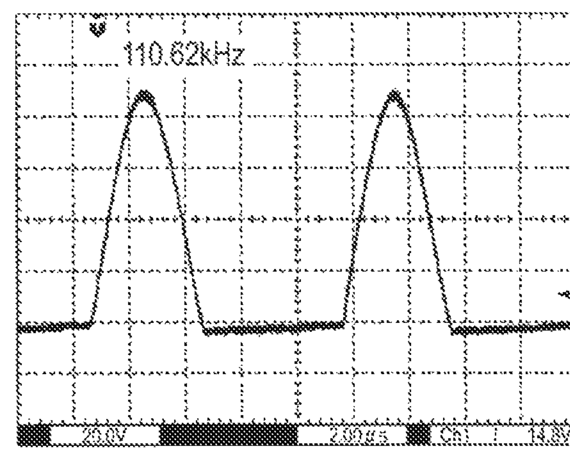
Figure 18A:
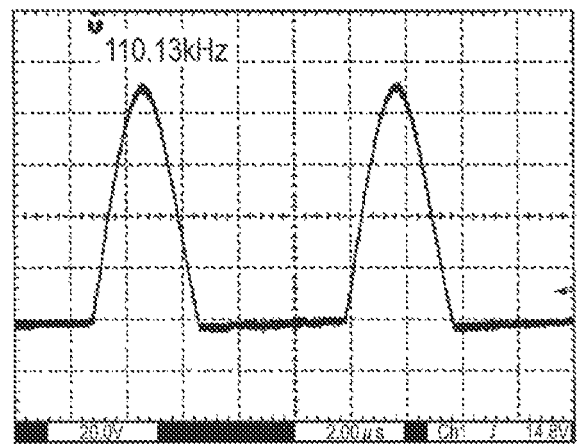
FIGS. 18A to 18C are more additional diagrams of measurement results showing relationships between drive frequencies and drain voltages (electric potentials at node Ng) of the power MOSFET.
Figure 18B:
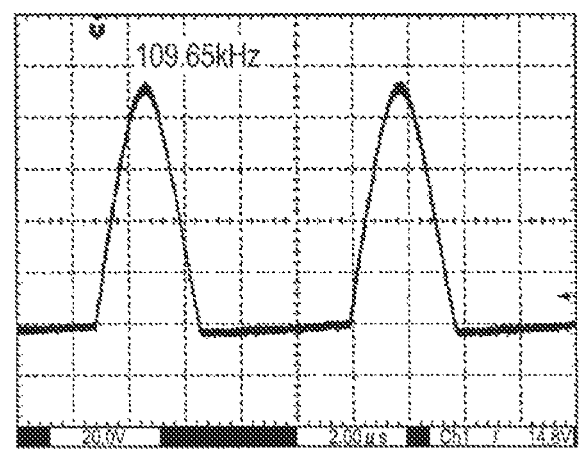
Figure 18C:
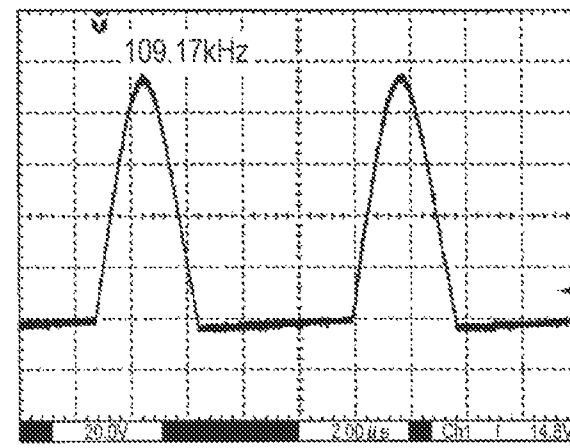
Figure 19:
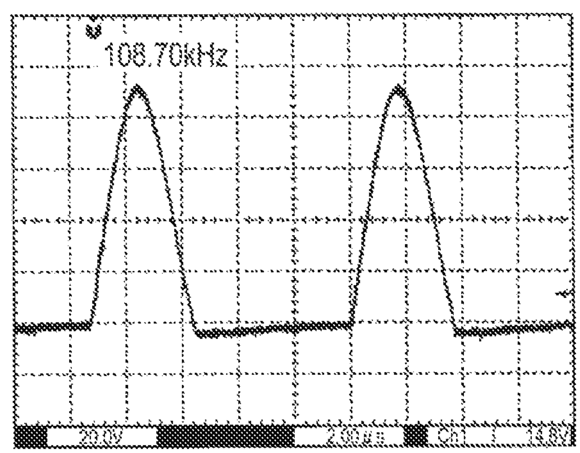
FIG. 19 is another diagram of a measurement result showing a relationship between a drive frequency and a drain voltage (electric potential at node Ng) of the power MOSFET.

Next, an example of a control method by operation unit 508 is described in detail by referring to FIG. 13. FIG. 13 is a flowchart schematically showing procedures of the control method by operation unit 508. Although the procedures in FIG. 13 are illustrated in the flowchart, the procedures can be realized by hardware designed by using a logic description language such as a hardware description language (HDL).

A count cycle value is set in cycle value register 507 before the procedures in FIG. 13 are started. As the count cycle value, a value 1B58hex in hexadecimal (which is equal to 7000 in decimal) may be set with respect to a clock frequency of 50 MHz, for example. Timer circuit 506 outputs a pulse signal with a pulse cycle of 140 μs to ADC 500 and operation unit 508 by using this count cycle value. Thus, ADC 500 executes A/D conversion at the 140-microsecond cycle, and supplies digital voltage signal 314D to comparator 510. Operation unit 508 executes a digital operation in synchronism with the pulse signal having the 140-microsecond cycle.

Referring to FIG. 13, when reset signal 309 at the H level is inputted into reset terminal RST, operation unit 508 causes 19-bit register 514 to store an initial value of frequency division ratio data FD in response to the input (in step S601). Specifically, a value 116hex corresponding to upper limit fstart of the drive frequency range is set as the initial value of the 9 most significant bits of the frequency division ratio data FD, namely, frequency division ratio integer portion FD [18:10]. In addition, a value 000hex is set as the initial value of the 10 least significant bits of frequency division ratio data FD, namely, frequency division ratio fractional portion FD [9:0]. As a result, a value 45800hex is set in 19-bit register 514 as the initial value (a 19-bit value) of frequency division data FD.

Thereafter, operation unit 508 stands by until a pulse edge is inputted from comparator 510 (if NO in step S602). Once the pulse edge is inputted from comparator 510 (if YES in step S602), operation unit 508 detects the pulse edge, and determines whether or not the logic level of the inputted signal from comparator 510 is at the H level (in step S603).

The logic level of the inputted signal from comparator 510 is determined to be at the H level if the actual measurement value is below the target value (if YES in step S603). In this case, operation unit 508 generates new frequency division ratio data by adding the output value from table register 504 to a current value (a 19-bit value) of frequency division data FD stored in 19-bit register 514 (in step S604).

Subsequently, operation unit 508 determines whether or not value FDi of frequency division ratio integer portion FD [18:10] exceeds upper limit value FDe (=1C6hex) corresponding to frequency fend (in step S608). The process goes to step S612 if value FDi does not exceed upper limit value FDe (if NO in step S608). If value FDi exceeds upper limit value FDe (if YES in step S608), operation unit 508 generates new frequency division ratio data by: setting value FDi of frequency division ratio integer portion FD [18:10] in frequency division ratio data FD as upper limit value FDe (=1C6hex); and setting value FDd of frequency division ratio fractional portion FD [9:0] in 3FFhex (in step S610). Then, operation unit 508 stores new frequency division ratio data FD in 19-bit register 514 (in step S612). Thus, the drive frequency control in excess of lower limit frequency fend is prevented.

On the other hand, when the actual measurement value is equal to or above the target value, the logic level of the inputted signal from comparator 510 is determined to be at the L level in step S603 (NO in step S603). In this case, operation unit 508 generates new frequency division ratio data by subtracting the outputted value from table register 504 from the current value (the 19-bit value) of frequency division ratio data FD stored in 19-bit register 514 (step S605).

Subsequently, operation unit 508 determines whether or not value FDi of frequency division ratio integer portion FD [18:10] in new frequency division ratio data FD falls below lower limit value FDs (=116hex) corresponding to frequency fstart (in step S609). The process goes to step S612 if value FDi does not fall below lower limit value FDs (if NO in step S609). If value FDi falls below lower limit value FDs (if YES in step S609), operation unit 508 generates new frequency division ratio data by: setting value FDi of frequency division ratio integer portion FD [18:10] in frequency division ratio data FD as lower limit value FDs (=116hex); and setting value FDd of frequency division ratio fractional portion FD [9:0] in 000hex (step S611). Then, operation unit 508 stores new frequency division ratio data FD in 19-bit register 514 (step S612). Thus, the drive frequency control in excess of upper limit frequency fstart is securely prevented. After step S612, the process returns to step S602.

As the outputted values shown in FIG. 11, 9-bit control values, which indicates pulse widths corresponding to ON periods of power MOSFET 402, are stored in table register 530 of this embodiment. Frequency divider 517 is capable of generating drive pulse 312K having the pulse width corresponding to the control value by using the built-in counter. Accordingly, pulse generation circuit 513 is capable of changing the on-duty ratio of drive pulse 312K by changing the pulse width of drive pulse 312K in accordance with the frequency (the switching frequency) of the drive pulse to be applied to the control terminal (the gate) of power MOSFET 402.

As shown in FIG. 11, in table register 530, the outputted value corresponding to the pulse width of the drive pulse becomes greater as the inputted value corresponding to the value of the division frequency ratio becomes greater, while the outputted value corresponding to the pulse width of the drive pulse becomes smaller as the inputted value corresponding to the value of the division frequency ratio becomes smaller. In other words, the inputted value and the outputted value are directly proportional. Accordingly, pulse generation circuit 513 generates drive pulse 312K having the pulse width that makes the ON period of power MOSFET 402 shorter as the switching frequency becomes higher, and generates drive pulse 312K having the pulse width that makes the ON period of power MOSFET 402 longer as the switching frequency becomes lower. Thereby, even when piezoelectric transducers 304K, 304Y, 304M, 304C are intended to be driven at a high drive frequency equal to or above about 140 kHz, for example, it is still possible to supply a gate voltage to set power MOSFET 402 into the ON state at the point when the drain potential is equal to 0 volt. Thus, a failure or malfunction of power MOSFET 402 can be avoided.

FIGS. 14A to 14C, 15A to 15C, 16A to 16C, 17A to 17C, 18A to 18C, and 19 are measurement results showing relationships between drive frequencies and drain voltages (electric potentials at node Ng) of power MOSFET 402. The values of the drive frequencies are indicated on the respective graphs of the measurement results. At a drive frequency of 109.17 kHz close to the resonance frequency, the drain voltage is in a half sine waveform and has a long 0-volt period. On the other hand, when the drive frequency is raised as high as about 147.93 kHz, the drain voltage is in a waveform close to a sine waveform, and has a short 0-volt period. Meanwhile, FIG. 20 is a diagram showing ratios (in percentage) of the 0-volt period to one cycle of the drain voltage, which are obtained from the measurement results in FIGS. 14A to 14C, 15A to 15C, 16A to 16C, 17A to 17C, 18A to 18C, and 19 and are sorted by the drive frequencies. As shown on the table in FIG. 20, it is learned that the ratio of the 0-volt period of the drain voltage is increased more as the drive frequency becomes lower.

Figure 21B:
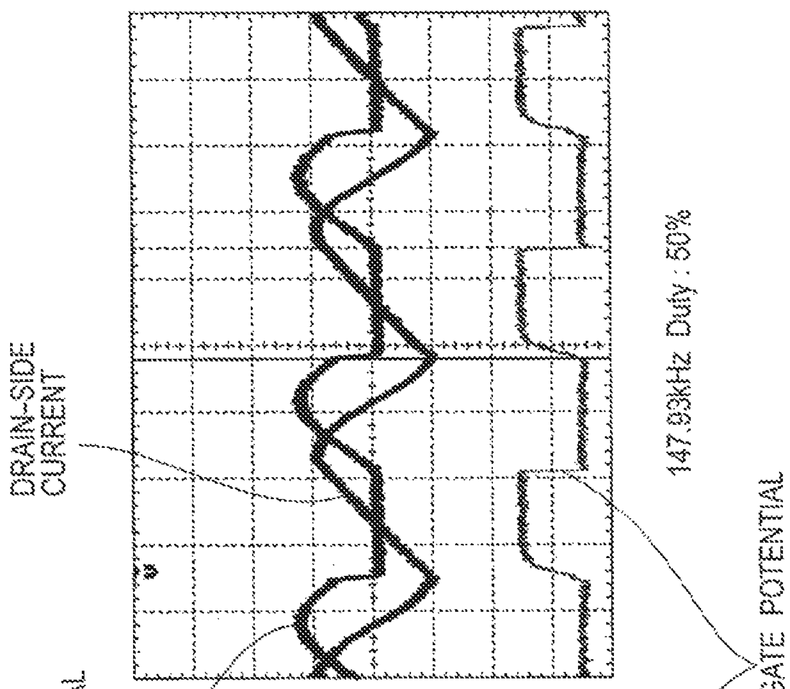
FIGS. 21A and 21B are graphs showing measurement results of drain potentials, drain-side currents (currents flowing through node Ng), and gate potentials of comparative examples.
Figure 21A:
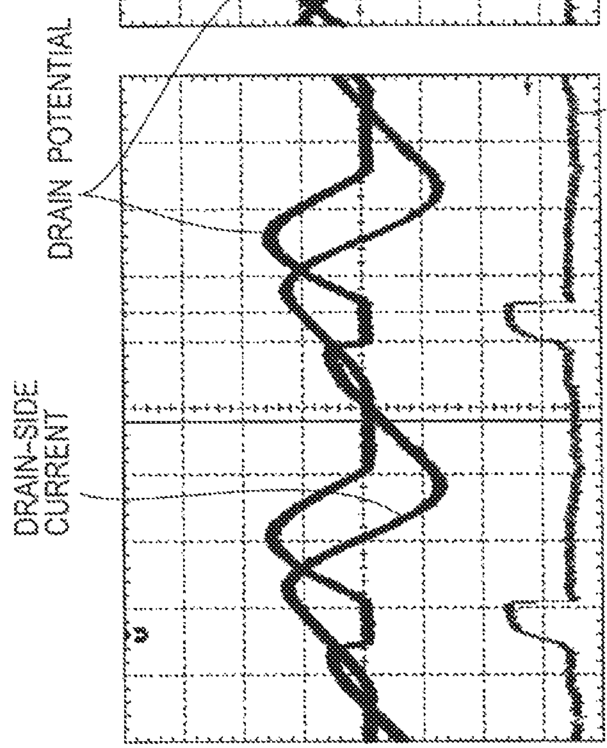

From the viewpoint of securely ensuring an operation margin of power MOSFET 402, the ON period of power MOSFET 402 is preferably set within a range of ⅔ of the 0-volt period to no greater than the full 0-volt period. If the ON period is shorter than ⅔ of the 0-volt period, it is likely that: the drain potential rises during an OFF period of power MOSFET 402; and an overcurrent flows through and destroys power MOSFET 402. On the other hand, if the ON period is longer than the 0-volt period, power MOSFET 402 transitions to the ON state before the drain potential falls. FIGS. 21A and 21B are graphs showing measurement results of drain potentials, drain-side currents (currents flowing through node Ng), and gate potentials of comparative examples. FIG. 21A is the graph showing the case where the drive frequency is set at 110.62 kHz and the on-duty ratio is set at 15%, and FIG. 21B is the graph showing the case where the drive frequency is set at 147.93 kHz and the on-duty ratio is set at 50%. It is confirmed that the overcurrent flows through and destroys power MOSFET 402 in the cases of FIGS. 21A and 21B. Particularly, in the case of FIG. 21A, power MOSFET 402 transitions to the ON state before the drain voltage becomes equal to 0 volt, and power MOSFET 402 causes a malfunction.

Figure 22A:
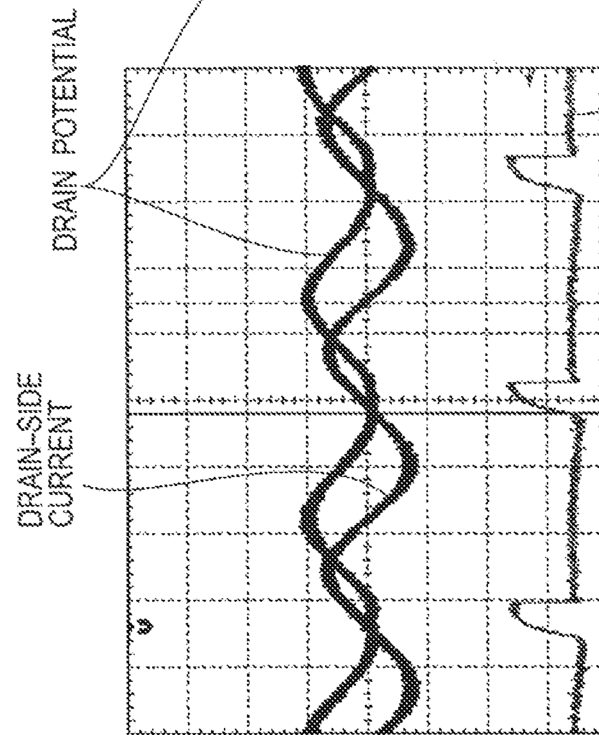
FIGS. 22A and 22B are graphs showing measurement results of drain potentials, drain-side currents (currents flowing through node Ng), and gate potentials generated by a control method of the first embodiment.
Figure 22B:
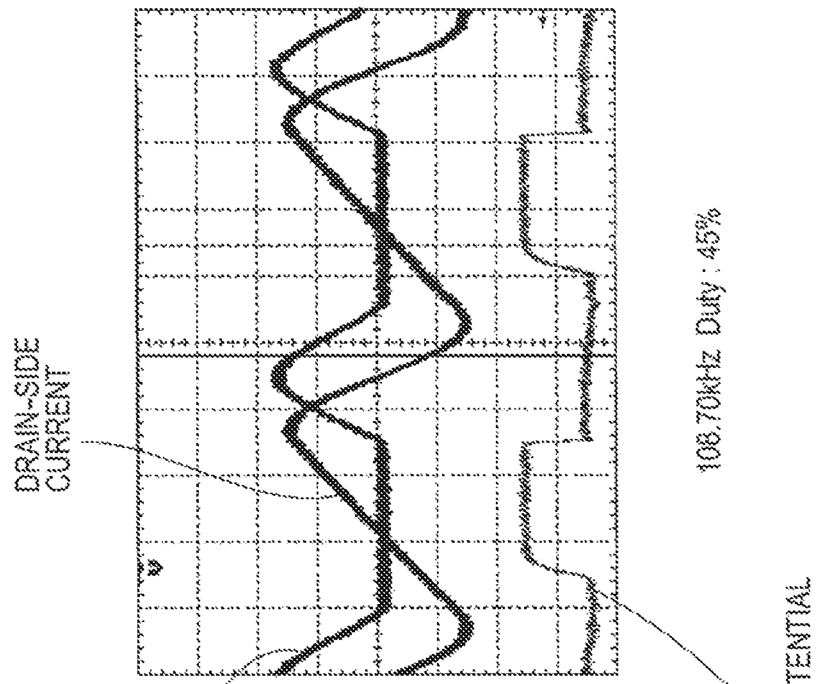

Meanwhile, FIGS. 22A and 22B are graphs showing measurement results of drain potentials, drain-side currents (currents flowing through node Ng), and gate potentials generated by the control method of this embodiment. FIG. 22A is the graph showing the case where the drive frequency is set at 147.93 kHz and the on-duty ratio is set at 15%, and FIG. 22B is the graph showing the case where the drive frequency is set at 108.70 kHz and the on-duty ratio is set at 45%. As shown in FIGS. 22A and 22B, the on-duty ratio of the drive pulse to power MOSFET 402 is equal to 15% when the drive frequency is set at 147.93 kHz, and the on-duty ratio is equal to 45% when the drive frequency is set at 108.70 kHz. Thus, it is possible to ensure the operation margin of power MOSFET 402, and to reduce power consumption.

Figure 23:
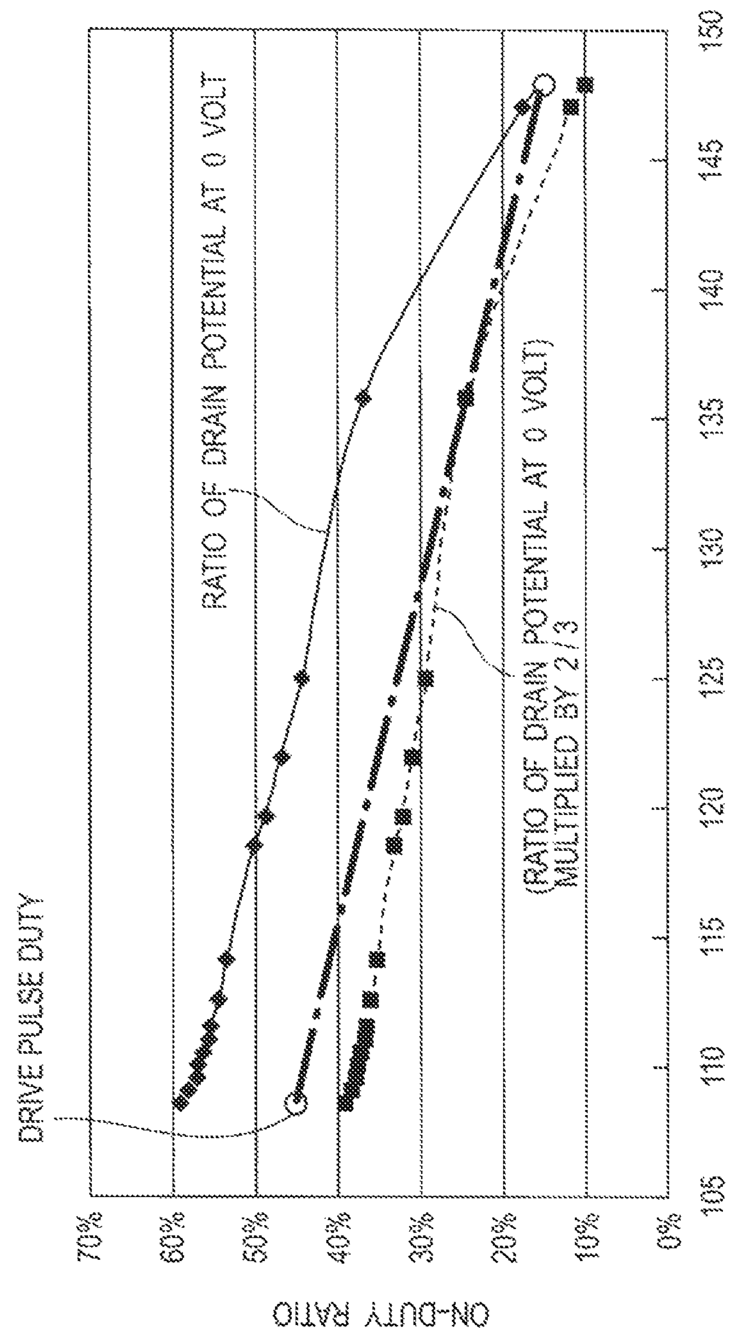
FIG. 23 is a graph in which the results in FIG. 20 (the ratios of the drain potentials at 0 V) are plotted with a solid line.

FIG. 23 is a graph in which the results in FIG. 20 (the ratios of the drain potential at 0 V) are plotted with a solid line. The results obtained by multiplying the ratios of the drain potential at 0 V by ⅔ are also plotted with a broken line in FIG. 23. Meanwhile, the on-duty ratio is preferably controlled within a range between the solid line and the broken line, as indicated with a chain line in the graph. Thereby, the operation margin of power MOSFET 402 can be securely ensured.

As described above, in the first embodiment, the on-duty ratio of the drive pulse is made variable in response to the switching frequency applicable to power MOSFET 402 serving as the switching element (i.e., the drive frequency applicable to the piezoelectric transducer). Thus, the efficient on-duty ratio can be selected at any time. Accordingly, it is possible to ensure the operation margin of power MOSFET 402, and to reduce power consumption.

Second Embodiment

Next, a second embodiment of the invention is described. The configuration of an image formation apparatus of the second embodiment is the same as the configuration of image formation apparatus 100 of the above-described first embodiment with the exception of the configuration of the high-voltage control circuit.

Figure 24:
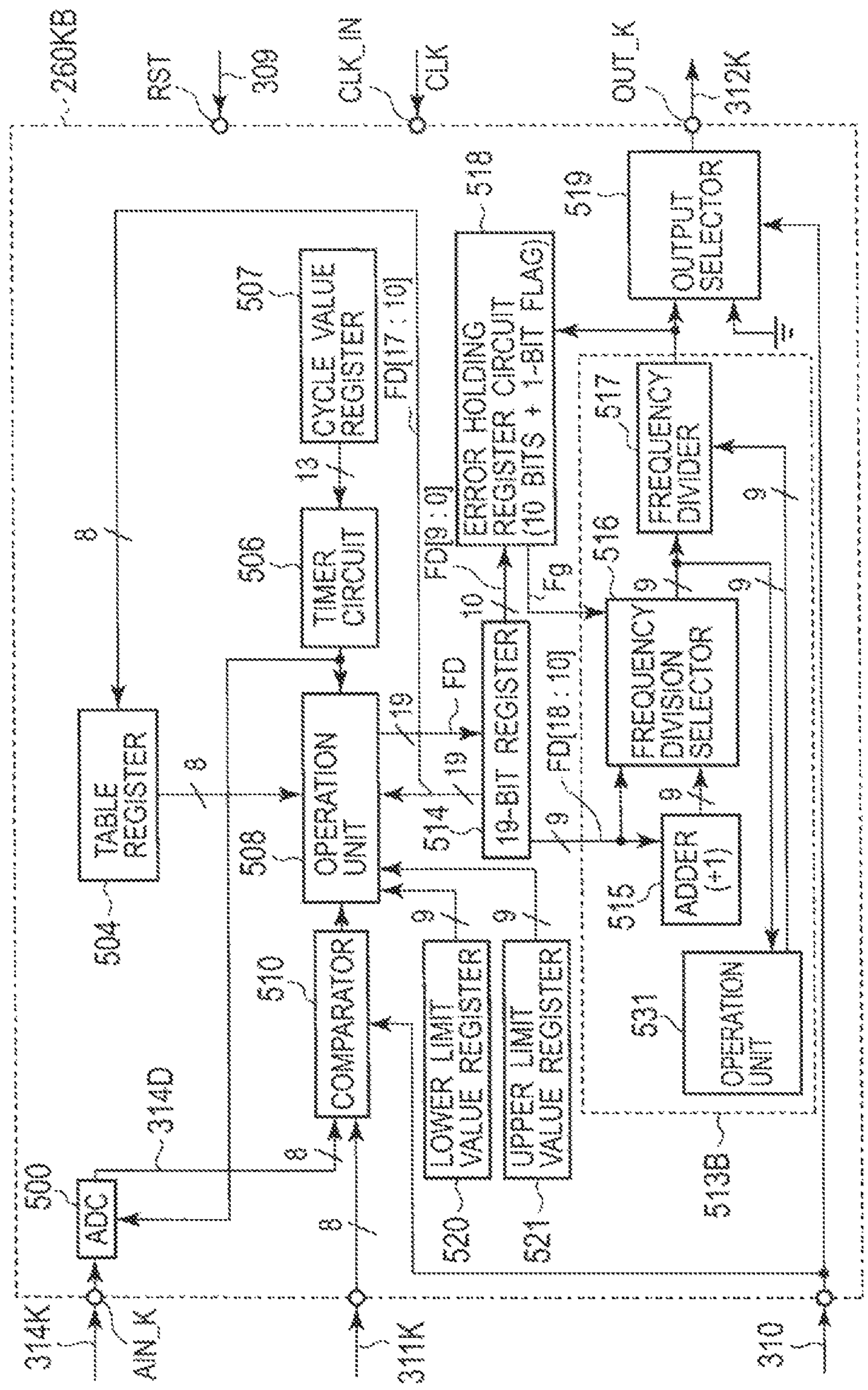
FIG. 24 is a diagram showing a basic configuration of a high-voltage controller of a second embodiment of the invention.

FIG. 24 is a diagram showing a basic configuration of high-voltage controller 260 KB for black images of the second embodiment. The basic configurations of the other high-voltage controllers for yellow images, magenta images, and cyan images of this embodiment are the same as the basic configuration shown in FIG. 24, and detailed description thereof are therefore omitted. The configuration of high-voltage controller 260 KB of this embodiment is the same as the configuration (FIG. 5) of high-voltage controller 260K of the above-described first embodiment with the exception of operation unit 531 in pulse generation circuit 513B shown in FIG. 24.

Figure 25:
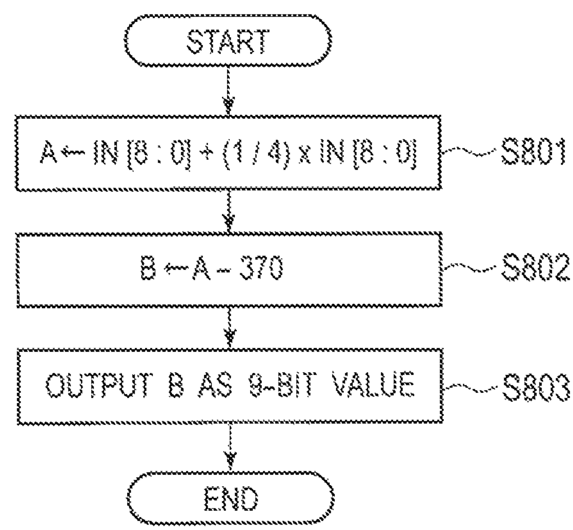
FIG. 25 is a flowchart schematically showing an example of procedures to calculate a control value of the second embodiment.

Operation unit 531 has a function to calculate a control value indicating a pulse width corresponding to a frequency division ratio. FIG. 25 is a flowchart schematically showing an example of procedures to calculate the control value. As shown in FIG. 25, once a value of 9-bit IN [8:0] is inputted, operation unit 531 obtains intermediate value A by adding IN [8:0] to a value resulting from multiplying together ¼ and what is obtained by shifting IN [8:0] to the right by 2 bits (in step S801). Subsequently, operation unit 531 obtains control value B by subtracting a predetermined value (=370 (in decimal number)) from intermediate value A (in step S802). Then, operation unit 531 outputs control value B as the 9-bit value (in step S803).

As described above, operation unit 531 of the second embodiment is capable of obtaining the control value, which is directly proportional to the inputted value, by doing the arithmetic, and outputting the control value to frequency divider 517. In addition, the on-duty ratio of the drive pulse is made variable in response to the switching frequency applicable to the power MOSFET serving as the switching element (i.e., the drive frequency applicable to the piezoelectric transducer). Thus, the efficient on-duty ratio can be selected at any time. Accordingly, it is possible to secure the operation margin of power MOSFET 402 and to reduce power consumption.

Here, control value B is virtually a result of doing the arithmetic using a first order polynomial. However, without limitation to the foregoing, the configuration of operation unit 531 may be changed so as to output a result of doing the arithmetic using a second or higher order polynomial. In addition, the coefficients and constants used for the arithmetic may be used while rewritably stored in a storage unit such as a non-volatile memory.

Modifications of First and Second Embodiments

Although the foregoing descriptions are provided for various embodiments of the invention by referring to the drawings, the embodiments are mere examples of the invention, and it is possible to employ various other aspects in addition to the embodiments. For example, the image formation apparatus of the above-described first or second embodiment is an image formation apparatus of the so-called color tandem type. However, the high-voltage power supply devices of the first and second embodiments are also applicable to an image formation apparatus of a monochrome type. In addition, the high-voltage power supply devices of the first and second embodiments are also applicable to a bias source used for the charge process, the development process, and so forth in addition to the transfer process.

In the meantime, the resonance characteristic of any of piezoelectric transducers 304K, 304Y, 304M, 304C varies depending on the type of any of piezoelectric transducers 304K, 304Y, 304M, 304C and on the configuration of a primary-side drive circuit thereof. Accordingly, the on-duty ratio of the drive pulse to be supplied to power MOSFET 402 needs to be changed depending on the resonance characteristic.

In addition, all or part of the configuration of high-voltage control circuit 260 described above may be realized by using hardware or realized by using a program that causes a processor such as a CPU (central processing unit) to execute the processing. Otherwise, high-voltage control circuit 260 may include an ASIC (application specific integrated circuit), which is an integrated circuit designed for a specific purpose by combining two or more functional circuits together, or by using a field-programmable gate array (FPGA) that is a type of gate array in which users can write a logic circuit on their own.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A piezoelectric transducer driver configured to drive a piezoelectric transducer for converting an inputted alternating-current voltage, comprising:

- a drive circuit configured to generate the alternating-current voltage to be inputted into the piezoelectric transducer;
- a frequency controller configured to control a frequency of the alternating-current voltage as a drive frequency to be applied to the piezoelectric transducer; and a pulse generation circuit configured to generate a drive pulse having a switching frequency corresponding to the drive frequency and to output the drive pulse to the drive circuit, wherein the drive circuit includes a switching element configured to generate the alternating-current voltage by executing a switching operation corresponding to a pulse width of the drive pulse, wherein the pulse generation circuit changes the pulse width depending on the switching frequency, and wherein the pulse generation circuit comprises:

a frequency divider configured to generate the drive pulse by dividing a frequency of a reference clock using a frequency division ratio designated by the frequency controller; and a look-up table storing data indicating a correspondence relationship between the frequency division ratio and the pulse width, and wherein the frequency divider selects the pulse width of the drive pulse based on the look-up table.

2. The piezoelectric transducer driver according to claim 1, wherein the pulse generation circuit generates the drive pulse with the pulse width making an ON period of the switching element shorter as the switching frequency becomes higher, and the ON period of the switching element longer as the switching frequency becomes lower, a waveform of a drain voltage of the switching element is a half sine wave of a positive voltage, and the ON period of the switching element is in a range of two-thirds of a zero-volt period in one cycle of the drain voltage to the zero-volt period, both inclusive.

3. The piezoelectric transducer driver according to claim 2, wherein the pulse generation circuit comprises a table register including the look-up table, wherein the table register outputs a control value to the frequency divider when a value of the frequency division ratio is inputted, the control value indicating the pulse width corresponding to the value of the frequency division ratio, and the frequency divider selects the pulse width of the drive pulse based on the control value.

4. The piezoelectric transducer driver according to claim 2, wherein the pulse width is selected in such a manner that an ON period of the switching element is directly proportional to the frequency division ratio.

5. The piezoelectric transducer driver according to claim 2, wherein the pulse generation circuit is configured to generate the drive pulse by dividing the frequency of the reference clock based on an N-bit value designated by the frequency controller, where N is an integer of 2 or above, and the frequency controller changes the frequency division ratio by changing the N-bit value.

6. The piezoelectric transducer driver according to claim 5, further comprising:

an error holding circuit configured to accumulate an M-least-significant-bit value of the N-bit value where M is a positive integer below N, and to store the accumulated value as an error, wherein the pulse generation circuit generates the drive pulse by dividing the frequency of the reference clock using a K-most-significant-bit value of the N-bit value where K=N−M, and temporarily increases the K-most-significant-bit value when the error exceeds a threshold, and the error holding circuit changes the error to a value below the threshold when the error exceeds the threshold.

7. The piezoelectric transducer driver according to claim 6, wherein the K-most-significant-bit value is used as a value of the frequency division ratio.

8. The piezoelectric transducer driver according to claim 6, wherein the error holding circuit causes the error to overflow when the error exceeds the threshold, and the pulse generation circuit temporarily increases the K-most-significant-bit value in response to the overflow of the error.

9. A power supply device comprising the piezoelectric transducer and the piezoelectric transducer driver according to claim 1.

10. An image formation apparatus comprising:

an image formation unit configured to form an image on a medium; and the power supply device according to claim 9.

11. A piezoelectric transducer driver configured to drive a piezoelectric transducer for converting an inputted alternating-current voltage, comprising:

a drive circuit configured to generate the alternating-current voltage to be inputted into the piezoelectric transducers;

a frequency controller configured to control a frequency of the alternating-current voltage as a drive frequency to be applied to the piezoelectric transducer; and a pulse generation circuit configured to generate a drive pulse having a switching frequency corresponding to the drive frequency, and to output the drive pulse to the drive circuit, wherein the drive circuit includes a switching element configured to generate the alternating-current voltage by executing a switching operation corresponding to a pulse width of the drive pulse, wherein the pulse generation circuit changes the pulse width depending on the switching frequency, and wherein the pulse generation circuit comprises:

a frequency divider configured to generate the drive pulse by dividing a frequency of a reference clock using a frequency division ratio designated by the frequency controller; and an operation unit configured to calculate a control value indicating the pulse width corresponding to the frequency division ratio, and wherein the frequency divider selects the pulse width of the drive pulse based on the control value.

12. The piezoelectric transducer driver according to claim 11, wherein the pulse generation circuit generates the drive pulse with the pulse width making an ON period of the switching element shorter as the switching frequency becomes higher, and the ON period of the switching element longer as the switching frequency becomes lower, a waveform of a drain voltage of the switching element is a half sine wave of a positive voltage, and the ON period of the switching element is in a range of two-thirds of a zero-volt period in one cycle of the drain voltage to the zero-volt period, both inclusive.

13. A power supply device comprising the piezoelectric transducer and the piezoelectric transducer driver according to claim 11.

14. An image formation apparatus comprising:

an image formation unit configured to form an image on a medium; and the power supply device according to claim 13.

15. A piezoelectric transducer driver configured to drive a piezoelectric transducer for converting an inputted alternating-current voltage, comprising:

a drive circuit configured to generate the alternating-current voltage to be inputted into the piezoelectric transducer;

a frequency controller configured to control a frequency of the alternating-current voltage as a drive frequency to be applied to the piezoelectric transducer; and a pulse generation circuit configured to generate a drive pulse having a switching frequency corresponding to the drive frequency, and to output the drive pulse to the drive circuit, wherein the drive circuit includes a switching element configured to generate the alternating-current voltage by executing a switching operation corresponding to a pulse width of the drive pulse, wherein the pulse generation circuit changes the pulse width depending on the switching frequency, wherein the pulse generation circuit generates the drive pulse with the pulse width making an ON period of the switching element shorter as the switching frequency becomes higher, and the ON period of the switching element longer as the switching frequency becomes lower, wherein a waveform of a drain voltage of the switching element is a half sine wave of a positive voltage, and wherein the ON period of the switching element is in a range of two-thirds of a zero-volt period in one cycle of the drain voltage to the zero-volt period, both inclusive.

16. A power supply device comprising the piezoelectric transducer and the piezoelectric transducer driver according to claim 15.

17. An image formation apparatus comprising:

an image formation unit configured to form an image on a medium; and the power supply device according to claim 16.

18. A piezoelectric transducer driver configured to drive a piezoelectric transducer for converting an inputted alternating-current voltage, comprising:

a drive circuit configured to generate the alternating-current voltage to be inputted into the piezoelectric transducer;

a frequency controller configured to control a frequency of the alternating-current voltage as a drive frequency to be applied to the piezoelectric transducer; and a pulse generation circuit configured to generate a drive pulse having a switching frequency corresponding to the drive frequency, and to output the drive pulse to the drive circuit, wherein the drive circuit includes a switching element configured to generate the alternating-current voltage by executing a switching operation corresponding to a pulse width of the drive pulse, wherein the pulse generation circuit changes the pulse width depending on the switching frequency, and wherein the driver circuit further comprises a resonance circuit connected to a controlled terminal of the switching element.

19. The piezoelectric transducer driver according to claim 18, wherein the pulse generation circuit generates the drive pulse with the pulse width making an ON period of the switching element shorter as the switching frequency becomes higher, and the ON period of the switching element longer as the switching frequency becomes lower, a waveform of a drain voltage of the switching element is a half sine wave of a positive voltage, and the ON period of the switching element is in a range of two-thirds of a zero-volt period in one cycle of the drain voltage to the zero-volt period, both inclusive.

20. The piezoelectric transducer driver according to claim 19, wherein the resonance circuit is an LC resonance circuit including a coil and a capacitor.

21. A power supply device comprising the piezoelectric transducer and the piezoelectric transducer driver according to claim 18.

22. An image formation apparatus comprising:

an image formation unit configured to form an image on a medium; and the power supply device according to claim 21.

* * * * *